United States Patent
Niwa et al.

(10) Patent No.: US 6,639,925 B2
(45) Date of Patent: Oct. 28, 2003

(54) OPTICAL INFORMATION PROCESSING EQUIPMENT AND SEMICONDUCTOR LIGHT EMITTING DEVICE SUITABLE THEREFOR

(75) Inventors: Atsuko Niwa, Hachioji (JP); Tsukuru Ohtoshi, Hanno (JP); Takao Kuroda, Tokorozawa (JP); Makoto Okai, Tokorozawa (JP); Takeshi Shimano, Tokorozawa (JP)

(73) Assignee: Hitachi, Inc., Tokyo (JP)

( * ) Notice: Subject to any disclaimer, the term of this patent is extended or adjusted under 35 U.S.C. 154(b) by 0 days.

(21) Appl. No.: 09/964,519

(22) Filed: Sep. 28, 2001

(65) Prior Publication Data

US 2002/0031153 A1 Mar. 14, 2002

Related U.S. Application Data

(63) Continuation of application No. 09/297,147, filed as application No. PCT/JP97/03931 on Oct. 29, 1997, now Pat. No. 6,542,526.

(30) Foreign Application Priority Data

Oct. 30, 1996 (JP) .............................. 8-2878200
Dec. 20, 1996 (JP) .............................. 8-340934

(51) Int. Cl.[7] .................................. H01S 5/00
(52) U.S. Cl. ........................... 372/45; 257/76
(58) Field of Search ................ 372/45, 46; 257/76

(56) References Cited

U.S. PATENT DOCUMENTS

| | | | | |
|---|---|---|---|---|
| 5,006,908 A | * | 4/1991 | Matsuoka et al. | 257/76 |
| 5,146,465 A | * | 9/1992 | Khan et al. | 372/45 |
| 5,753,966 A | * | 5/1998 | Morita et al. | 372/45 |
| 5,812,576 A | * | 9/1998 | Bour | 372/45 |

FOREIGN PATENT DOCUMENTS

| | | | | |
|---|---|---|---|---|
| JP | 7297476 | 11/1995 | ............ | H01S/3/18 |
| JP | 8064912 | 3/1996 | | |
| JP | 8088441 | 4/1996 | ............ | H01S/3/18 |
| JP | 8191171 | 7/1996 | ............ | H01S/3/18 |
| JP | 8213692 | 8/1996 | ............ | H01S/3/18 |
| JP | 8274414 | 10/1996 | ............ | H01S/3/18 |
| JP | 62249496 | 10/1997 | ............ | H01S/3/18 |

OTHER PUBLICATIONS

English language translation of JP–07–297476–A.*
Appl. Phys. Letter., 64(13)(1994), pp. 1687–1689, Mar. 1994.
Appl. Phys. Letter., 69(26)(1996), pp. 4056–4058, Dec. 1996.
Appl. Phys., vol. 35 (1996), Pt. 2, No. 1B, pp. L74–L76 (1–1.Article, No. 3), Jan. 1996.

* cited by examiner

*Primary Examiner*—Quyen Leung
(74) *Attorney, Agent, or Firm*—Antonelli, Terry, Stout & Kraus, LLP

(57) ABSTRACT

An information processor of a high reliability and a high recording density, and a blue color, blue-violet color and violet color based semiconductor light emitting device operable at a low threshold current density, used for the same, are provided. An optical information processor of a high reliability and a high recording density enables a moving picture, such as a high-definition television picture, to be recorded and reproduced satisfactorily. A barrier layer in a quantum-well active layer of a semiconductor light emitting device is doped with n-type impurities at a high density. Alternatively, the face orientation of a quantum-well active layer of a semiconductor light emitting device is a plane inclined from the (0001) plane, whereby the threshold current value of the semiconductor light emitting device can be decreased. The semiconductor light emitting device is typified by a gallium nitride based compound semiconductor laser device.

9 Claims, 22 Drawing Sheets

WAVE NUMBER (nm$^{-1}$)

OPTICAL INFORMATION PROCESSING EQUIPMENT AND SEMICONDUCTOR LIGHT EMITTING DEVICE SUITABLE THEREFOR

This is a continuation of U.S. application Ser. No. 09/297,147, filed on Apr. 26, 1999 U.S. Pat. No. 6,542,526, which is a section 371 of International Application No. PCT/JP97/03931, filed Oct. 29, 1997, and the entire disclosures of which are incorporated herein by reference.

TECHNICAL FIELD

The present invention relates to optical information processing equipment such as an optical disk apparatus and a light source, particularly, a semiconductor light emitting device suitable therefor.

BACKGROUND ART

With regard to optical information processing equipment represented by a DVD (Digital Video Disk) apparatus, there have been strong demands to increase the capacity thereof. In particular, it has been required to provide optical information processing equipment capable of processing images of high-definition TVs. As such information processing equipment, there has been generally known a type adopting a photomagnetic recording or phase transition recording method. However, there has yet to be realized an optical recording equipment capable of sufficiently processing dynamic images of high-definition TVs.

On the other hand, with regard to a semiconductor light emitting device used as a light source of such optical information equipment, it has been required to shorten the wavelength toward a wavelength range from that of blue light to that of near ultraviolet light. The reason for this is that a blue color based semiconductor light emitting device is useful for high density recording or reproducing of information in or from a recording medium because such a light emitting device is capable of emitting light having a shorter-wavelength thereby focusing the light at a smaller light spot.

Based on such a background, development has been actively made of a blue color semiconductor light emitting device using a gallium nitride based compound semiconductor such as GaN, GaAlN, InGaN or InGaAlN allowing emission of light having a wavelength in a wavelength range from that of blue light to that of ultraviolet light.

At present, as a light emitting device using the above-described material, a high-intensity blue color LED having a double-hetero structure using a Zn-doped InGaN layer provided on a sapphire substrate as a light emitting layer has been put in practical use (S. Nakamura et al., Appl. Phys. Lett., 64 (1994) 1687). In recent years, continuous oscillation at room temperature of a semiconductor laser device using an undoped InGaN quantum-well layer provided on a sapphire substrate as a light emitting layer has been realized (S. Nakamura et al., Appl. Phys. Lett. 69 (1996) 4056) This semiconductor laser device, however, has required a high operational current density, thereby failing to obtain sufficient characteristics from the viewpoint of practical use. Also, in recent years, pulsive oscillation at room temperature of a semiconductor laser using an undoped InGaN quantum-well layer provided on a sapphire substrate as a light emitting layer has been realized (S. Nakamura et al., Jpn. J. Appl. Phys. 35 (1996) L74). This semiconductor laser device, however, has also required a high operational current density, thereby failing to realize continuous oscillation thereof.

In the meantime, a semiconductor laser device including an active layer of a modulation doping structure, thereby allowing operation at a low threshold value has been disclosed in Japanese Patent Laid-open No. Sho 62-249496.

A semiconductor light emitting device of a type using a gallium nitride based material has been also reported, for example, in Jap. J. Appl. Phys. Vol. 35 (1996) Pt. 2, No. 1B, pp. L74–L76, or Japanese Patent Laid open No. Hei 8-64912. The former document has disclosed a semiconductor laser device having an InGaN based multi-quantum well structure, and the latter document has disclosed a semiconductor light emitting device using a gallium nitride based material. In the methods disclosed in both the documents, the semiconductor light emitting device is configured by forming a wurtzite type gallium nitride based semiconductor layer on a sapphire substrate. In addition, the active layer in the latter device has no quantum-well structure.

DISCLOSURE OF INVENTION

1. Information Processing Equipment

A first object of the present invention is to provide information processing equipment capable of sufficiently recording or reproducing even dynamic images in or from high-definition TVs or the like. The optical information processing equipment is typically configured as an optical disk apparatus adopting, for example, photomagnetic recording or phase transition recording method.

A second object of the present invention is to provide optical information processing equipment capable of ensuring recording or reproducing of high-definition dynamic images under various environments, particularly, under a high temperature environment.

A third object of the present invention is to provide optical information processing equipment enabling high density recording and prolonging the service life.

It should be noted that the optical information processing equipment of the present invention allows not only writing operation of information but also reading operation of information.

Principal aspects of the present invention disclosed in this Description will be described below in connection with the above-described objects.

(1) According to a first aspect of the present invention, there is provided optical information processing equipment including at least a light source for irradiating a recording medium with light and an optical system for focusing light on the recording medium, and having a function of performing recording by changing a state of part of the recording medium, characterized in that a wavelength of light emitted from the light source is in a wavelength range of 350 nm to 550 nm, a threshold current density of the light source is in a range of 2.2 kA/cm$^2$ or less, and a recording density of the recording medium is in a range of 15 GB or more. To achieve the above object, the threshold current density of the light source is preferably in a range of 1.0 kA/cm$^2$ or less, more preferably, in a range of 0.8 kA/cm$^2$ or less.

The light source exhibiting a threshold current density in the above range is capable of sufficiently realizing optical output of 40 mW or more at a drive current of 100 mA, for example, at an atmospheric temperature of 70° C.

The optical information processing equipment of the present invention is significantly desirably usable while satisfying requirements of recording media such as high-definition TVs. In a high-definition TV, an information transfer speed for transferring a dynamic image is in the order of, for example, 10 MB/sec. The known recording equipment has failed to record such a large capacity of information. On the contrary, according to the inventive equipment, since the recording density of a recording medium is in the range of 15 GB or more, the equipment enables recording of a dynamic image in a high-definition TV. Also, according to the inventive equipment, since the light source allows emission of light in the wavelength range of 350 nm to 550 nm, that is, emission of visible light, particularly, blue light, violet light or ultraviolet light, the above-described recording density can be realized on one surface of the disk. Further, according to the inventive equipment, the threshold current density of the light source is low and, therefore, it is possible to require less power and, hence, to reduce the power consumption. The threshold current density of the light source of the inventive equipment is substantially reduced to half as compared with the general threshold current density of the conventional blue color or violet color based semiconductor laser device. Accordingly, the light source of the inventive equipment is able to reduce the drive power and hence to meet the practical requirements of the present product market.

To achieve the above objects, the wavelength of light emitted from the light source is preferably in a range of 350 nm to 430 nm. This is advantageous in simplifying the optical system.

(2) According to a second aspect of the present invention, there is provided optical information processing equipment including at least a light source for irradiating a recording medium with light and an optical system for focusing light on the recording medium, and having a function of performing recording by changing a state of part of the recording medium, characterized in that the light source is composed of a semiconductor laser device allowing emission of light in a wavelength range of 350 nm to 550 nm and having a threshold current in a range of 10 mA or less. It should be noted that the threshold current is the value measured at room temperature (20° C.).

Like the equipment according to the first aspect of the present invention, the optical information processing equipment according to this aspect is significantly desirably usable while satisfying requirements of recording media such as high-definition TVs. Also, according to the equipment according to this aspect, since the threshold current of the light source is in the range of 1.0 mA or less, it is possible to save the unavailable power and hence to reduce the power consumption. The threshold current density of the light source of the equipment according to this aspect is substantially reduced to half as compared with the general threshold current density of the conventional blue color based semiconductor laser device.

(3) According to a third aspect of the present invention, there is provided optical information processing equipment including at least a light source for irradiating a recording medium with light and an optical system for focusing light on the recording medium, and having a function of performing recording by changing a state of part of the recording medium, characterized in that a wavelength of light emitted from the light source is in a wavelength range of 350 nm to 550 nm, a threshold current density of the light source is in a range of 2.2 kA/cm$^2$ or less, a threshold current of the light source is in a range of 10 mA or less, and a recording density of the recording medium is in a range of 15 GB or more. In particular, to achieve the above object, the threshold current density of the light source is preferably in a range of 1.0 kA/cm$^2$ or less.

(4) According to a fourth aspect of the present invention, there is provided optical information processing equipment including at least a light source for irradiating a recording medium with light and an optical system for focusing light on the recording medium, and having a function of performing recording by changing a state of part of the recording medium, characterized in that a wavelength of light emitted from the light source is in a wavelength range of 350 nm to 550 nm, a recording density of the recording medium is in a range of 15 GB or more, and a drive current of the light source is in a range of 100 mA or less.

Like the equipment according to the first aspect of the present invention, the optical information processing equipment according to this aspect is significantly desirably usable while satisfying requirements of recording media such as high-definition TVs. Also, according to the equipment according to this aspect, since the drive current of the light source is low, it is possible to reduce the power consumption.

In the equipment according to this aspect, the threshold current density of the light source is preferably in a range of 2.2 kA/cm$^2$ or less and the threshold current of the light source is preferably in a range of 10 mA or less. In particular, to achieve the above objects, the threshold current density of the light source is more preferably in a range of 1.0 kA/cm$^2$ or less. It should be noted that each of the threshold current density and threshold current is the value measured at room temperature (20° C.).

In addition, the threshold current density is more preferably in a range of 1.7 kA/cm$^2$ or less. The same is true for some inventions of the following optical information processing equipment to be described later.

(5) According to a fifth aspect of the present invention, there is provided optical information processing equipment described in any one of the items (1) to (4), wherein the light source is composed of a semiconductor light emitting device including a light emitting region made from a compound semiconductor material having a hexagonal system.

In the optical information processing equipment according to this aspect, since the light source allows emission of light having a wavelength in the short-wavelength area of a visible light region and the recording density of a recording medium is 15 GB or more, the equipment enables recording of a dynamic image in a high-definition TV. Further, since the semiconductor light emitting device includes a light emitting region made from a compound semiconductor material having a hexagonal system, it is possible to reduce the threshold current value thereof.

(6) According to a sixth aspect of the present invention, there is provided optical information processing equipment described in the item (5), wherein the threshold current value is in a range of 100 mA or less, preferably, in a range of 70 mA. In particular, the threshold current value of the light source of the above optical information processing equipment is more preferably in a range of 40 mA.

Further, the light source is preferably configured as a semiconductor light emitting device having at least an active layer region having a strained quantum-well structure which is made from a wurtzite type semiconductor material. The threshold current value of such a semiconductor light emitting device is specified to be in a range of 100 mA or less, preferably, in a range of 70 mA or less. The active layer region having a strained quantum-well structure makes it easy to achieve a lower threshold current value. With this configuration, there can be realized optical recording equipment ensuring a recording density being as large as twice or more that of the conventional equipment, a high reliability, and a high service life.

While the optical information processing equipment described in each of the items (1) to (6) is described in terms of the writing function of information in a recording medium, the present invention can be also applied to the above equipment in terms of the reading function of information from a recording medium.

Even if the above equipment is required to exhibit both the writing and reading functions, it may be provided with only one semiconductor light emitting device because the semiconductor light emitting device is usable not only for the writing operation but also for the reading operation.

According to the inventive equipment, since the recording density of a recording medium is 15 GB or more, the equipment is able to process a dynamic image of a high-definition TV or the like. In this case, the writing operation requires an operational power in a range of about 20 mW to 40 mW, particularly, in a range of about 30 mW to 40 mW. On the other hand, the reading operation requires an operational power in a range of about 3 mW to 10 mW, particularly, in a range of about 4 mW to 5 mW. In addition, the setting of the operational power is dependent on the light availability of a reading or writing optical system. In general, the availability of an optical system for writing is about 30%, and accordingly, if the operational power for writing is set at a value ranging from 20 mW to 40 mW, the optical output required for writing in the film surface of a recording medium becomes a value ranging from about 0.9 mW to 1.2 mW. On the other hand, the availability of a read-only optical system is about 10%.

For example, in a next-generation DVD system using a light source allowing emission of light in a range of a blue light to ultraviolet light, a semiconductor laser device as the light source will require an operational current of 100 mA or less and an optical output of 40 mW for writing information in an optical disk. In the case of using a nitride based semiconductor laser most expected as the above semiconductor laser device, the characteristic temperature and slope efficiency are estimated at 120 K and 0.4 W/A, respectively, and accordingly, to assure high temperature operation at 70° C., it may be desirable to set the threshold current density in a range of 1.0 kA/cm$^2$ or less, preferably, in a range of 0.8 kA/cm$^2$ or less. At this time, in a high temperature environment of 70° C., the optical output of 40 mW required for detecting reflected light or recording information can be obtained at a current value of 100 mA or less. This makes it possible to realize optical recording equipment ensuring a recording density being as large as twice or more that of the conventional equipment, a high reliability, and a high service life, without changing the configuration of the existing system. Also, since the service life of a light emitting device is strongly dependent on the carrier density required for operation, the reduction in operational current density is of course effective to prolong the service life of the light emitting device.

The optical information processing equipment of the present invention will be described later in detail by way of the following embodiments. The optical information processing equipment is represented by an optical disk apparatus such as a DVD or compact disk apparatus, or a laser beam printer.

The various light sources suitable for the optical information processing equipment of the present invention will be described in detail in the following item "2. Semiconductor Light Emitting Device".

2. Semiconductor Light Emitting Device

A semiconductor light emitting device most suitable for the above-described optical information processing equipment is of a type allowing emission of blue light, violet light or ultraviolet light, which device is typically configured as a semiconductor laser device. Such a semiconductor light emitting device represented by a semiconductor laser device is capable of satisfying various requirements of the above optical information processing equipment. It should be noted that the semiconductor light emitting device, such as the semiconductor laser device, of the present invention can be applied not only to the optical information processing equipment described in this Description but also to other general applications matched with the characteristics of the device, such as a wavelength of light emitted therefrom.

At present, an attempt has been made to realize high density optical information processing equipment using a gallium nitride based semiconductor light emitting device; however, it has failed to put such equipment into practical use. A high operational current density of a gallium nitride based semiconductor light emitting device is the main cause of the above unsuccessful attempt.

The high operational current density of a gallium nitride based semiconductor light emitting device results from the fact that an effective mass of the valence band of the material (semiconductor material) is larger than that of a semiconductor material having a zinc-blend type crystal structure such as GaAs. Also, in a wurtzite type semiconductor, energy dispersion in the valence band is little changed even by applying a biaxial strain within crystal planes of crystals in a quantum-well layer (semiconductor layer causing carrier recombination concerning light emission) which is generally stacked in parallel to the (0001) plane. As a result, in a GaN based semiconductor having a wurtzite type crystal structure, it is not expected to reduce the state density due to epitaxial strain within the (0001) plane. Further, even if a technology associated with a semiconductor light emitting device made from a semiconductor material having the zinc-blend type crystal structure, for example, disclosed in Japanese Patent Laid-open No. Sho 62-249496 is applied to the above GaN based semiconductor having the wurtzite type crystal structure, a sufficient effect of reducing the operational current of the GaN based semiconductor is not obtained.

Accordingly, a fourth object of the present invention is to provide a semiconductor light emitting device allowing emission of blue based light, blue-violet based light, and ultraviolet based light and ensuring a low threshold current density. The reduction in threshold current density reasonably leads to a reduction in operational current density of the light source.

As the semiconductor light emitting device allowing blue based light, blue-violet based light and ultraviolet based light, there may be used not only a semiconductor laser device, but also a semiconductor device having a hetero junction such as pn-junction or pin-junction and allowing light emission, for example, a light emitting diode device or super luminescent diode device.

The above-described fourth object of the present invention can be achieved by semiconductor light emitting devices roughly classified into three kinds different in standpoint. One invention relates to the carrier density in a light emitting region, and another invention relates to selection of crystal planes of semiconductor crystals of the light emitting region. The selection of crystal planes is further divided into two forms. Accordingly, the semiconductor light emitting devices of the present invention provided for achieving the fourth object are roughly classified into three types.

The first type semiconductor light emitting device of the present invention is characterized in that an n-type impurity is doped in a light emitting region having a quantum-well structure at a density of $5.0 \times 10^{18}$ cm$^{-3}$ to $1.0 \times 10^{20}$ cm$^{-3}$.

The density of an n-type impurity is preferably in a range of $1.5 \times 10^{19}$ cm$^{-3}$ to $5.0 \times 10^{19}$ cm$^{-3}$.

The second type semiconductor light emitting device of the present invention is characterized in that the oriented plane of a crystal region of a compound semiconductor having a hexagonal system, which region constitutes an active layer region of the semiconductor light emitting device composed of layers made from compound semiconductor materials, is a plane inclined from the (0001) plane. The inclination angle is in a range of 70° to 90°.

The inclination angle of the crystal plane may have a deviation, that is, a tolerance of 5° or less. The deviation, that is, tolerance of the inclination angle is not limited to the deviation of the inclined direction of the crystal plane, but it means the deviation, that is, tolerance of the crystal plane itself.

The third type semiconductor light emitting device of the present invention is characterized in that the oriented plane of a semiconductor crystal region constituting an active layer having a strained super lattice structure of the semiconductor light emitting device composed of layers made from compound semiconductor materials having a hexagonal system is a plane inclined from the (0001) plane at an inclination angle in a range of 3° to 70°.

The above compound semiconductor materials used for the semiconductor light emitting device of the present invention are represented by gallium nitride based compound semiconductor materials. The gallium nitride based compound semiconductors are classified into those having a wurtzite type crystal structure and those having a zinc-blend type crystal structure.

The configurations of the first type semiconductor light emitting device and second type light emitting device may be used singly or in combination. In each case, for example, when being configured as a semiconductor laser device, the semiconductor light emitting device is capable of reducing the carrier density required for oscillation of laser, although the degree of the effect is dependent on the form of the embodiment, thereby reducing the operational current density of the gallium nitride based semiconductor laser device. The third type semiconductor light emitting device can be also combined with the first type semiconductor light emitting device.

Hereinafter, principal configurations of the semiconductor light emitting devices disclosed in this Description will be described in detail.

2-1: Semiconductor Light Emitting Device of First Type (1) As a first aspect of the first type semiconductor light emitting device, there is provided a semiconductor light emitting device composed of at least compound semiconductors, the device including at least a first conduction type cladding layer; a second conduction type cladding layer; and an active layer region having a quantum-well structure, which layer is put between both the cladding layers and which has a well layer and barrier layers each having a forbidden band width larger than that of the well layer; characterized in that an n-type impurity is doped in the active layer region having the quantum-well structure, and the carrier density in the well layer is in a range of $5.0 \times 10^{18}$ cm$^{-3}$ to $1.0 \times 10^{20}$ cm$^{-3}$.

Here, it is important that an n-type impurity, typically, Si is doped in the active layer region.

(2) The carrier density of the above n-type impurity is preferably in a range of $1.5 \times 10^{19}$ cm$^{-3}$ to $5.0 \times 10^{19}$ cm$^{-3}$.

(3) As a second aspect of the first type semiconductor light emitting device, there is provided a semiconductor light emitting device described in the item (1) or (2), wherein the above n-type impurity is selectively doped in the barrier layer of the quantum-well active region. The structure in which an impurity is selectively doped is called a modulation-doped structure.

Additionally, it may be most desirable that the above n-type impurity be selectively present only in the barrier layer. In this case, the well layer does not substantially contain the impurity, and thereby it does not produce any unnecessary trap level. Accordingly, such a form is useful for the light emitting characteristic. From the viewpoint of practical use, however, it is allowed that the n-type impurity may pass through the barrier layer and be slightly distributed at the boundary region. Such an allowance of the n-type impurity is set in order to make easier the manufacture of the semiconductor light emitting device. The quantum-well structure not modulation-doped with an impurity will be described later.

The features of the first type semiconductor light emitting device of the present invention, classified into the above items (1) to (3), will be described below in detail.

Description will be made by example of a semiconductor light emitting device including a light emitting region having a quantum-well structure in which a well layer is put between barrier layers each having a forbidden band width broader (larger) than that of the well layer. Examples of such a light emitting region structure include a single quantum-well (SQW) structure in which one well layer is put between two barrier layers, and a multi-quantum well (MQW) structure in which a plurality of well layers and a plurality of barrier layers are alternately stacked. As the multi-quantum well structure, a strained multi-quantum well structure and a strain compensated multi-quantum well structure may, of course, be adopted.

In the case of providing a light emitting region having a quantum-well structure (hereinafter, referred to as "quantum-well active layer region") for carrying out the present invention, as described above, it may be desirable to selectively dope an impurity in the barrier layer at a high density. The features of such a quantum-well active layer region will be described below.

FIG. 1 shows a relationship between an injected carrier density and an optical gain for a modulation-doped quantum-well structure. More specifically, FIG. 1 shows the dependence of the injected carrier density on the maximum gain for a so-called GaN/Al$_{0.2}$Ga$_{0.8}$N modulation-doped quantum-well structure in which GaN layers (thickness: 5 nm each) and Al$_{0.2}$Ga$_{0.8}$N layers (thickness: 5 nm each) are alternately stacked. In this figure, a density Nd of an n-type impurity doped in a barrier layer is taken as a parameter. Here, carriers released from the impurity in the barrier layer are all supplied to a well layer. At this time, the electric charge neutralization condition is established throughout the quantum-well active layer, and therefore, if the thickness of the well layer is equal to that of the barrier layer, a density $n_0$ of the carriers having been released from the impurity and locally present in the well layer becomes equal to the density Nd of the impurity doped in the barrier ($n_0$=Nd). The case where the thickness of the well layer is different from that of the barrier layer will be described later.

The results of FIG. 1 shows that as the density Nd becomes larger, the carrier density (transparent carrier density) required for making positive the gain is shifted on the low injected carrier density side. Here, the wording "making positive the gain" means that the optical gain on the ordinate is made positive to the injected carrier density on the abscissa in FIG. 1. That is to say, as the intercept of each graph (rising rightwardly) on the abscissa becomes smaller, the transparent carrier density becomes smaller to reduce the carrier density required for light emission, that is, "threshold carrier density" in laser oscillation.

Based on the results shown in FIG. 1, a relationship associated with a net threshold current density Jnom is obtained as shown in FIG. 2. In this figure, a threshold gain gth (500 cm$^{-1}$, 1000 cm$^{-1}$, and 1500 cm$^{-1}$) is taken as a parameter. FIG. 2 shows a relationship between a donor concentration and a nominal current density. From the results of FIG. 2, it is understood that an effect of reducing the threshold current density appears by setting the density Nd of the modulation-doped impurity at a value ranging from 5×10$^{18}$ cm$^{-3}$ or more. Also, it is apparent that the threshold current density can be reduced to 80% or less of that obtained in the case of the undoped quantum-well structure by setting the density Nd of the modulation-doped impurity at a value ranging from 1.5×10$^{19}$ cm$^{-3}$ or more. However, when the density Nd of the impurity modulation-doped in the barrier layer is more than 5×10$^{19}$ cm$^{-3}$, the crystallinity of the barrier layer is significantly degraded, and therefore, it may be desirable that the density Nd of the impurity modulation-doped in the barrier layer be equal to or less than 5×10$^{19}$ cm$^{-3}$.

In general, with respect to a long-wavelength band n-type impurity modulation-doped laser, it is known that the temperature characteristic is degraded by carrier leakage on the conduction band side. However, with respect to a nitride based semiconductor, it was confirmed that since the band offset on the conduction band side can be made large, the current leakage can be suppressed to prevent degradation of the temperature characteristic by setting a difference in band gap energy between the quantum-well active layer and cladding layer at a value equal to or more than 0.35 eV.

The above description is made by way of the example in which an impurity is selectively doped in the barrier layer; however, to simplify the manufacturing process, the impurity may be doped in both the quantum-well layer and barrier layer in consideration of the required performance of the semiconductor light emitting device. In this case, the impurity may be partially doped in both the quantum-well layer and barrier layer or may be doped over the entire area of the quantum-well active region. The doping of the impurity in the quantum-well layer slightly degrades the performances of the light emitting device in terms of the quantum level and quantum size effect in the quantum-well layer; however, it is apparent that the doping of the impurity in both the quantum-well layer and barrier layer exhibits the effect of reducing the threshold carrier density as compared with the case where the entire area of the quantum-well active region is not doped with the impurity.

The same effect can be obtained by making larger the thickness of a barrier layer than that of a quantum-well layer. The thickness of the barrier layer may be set about twice that of the quantum-well layer from the viewpoint of the practical use. For example, in the case of the above modulation-doped structure, if the density of an n-type impurity doped in a barrier layer is set at 1.5×10$^{19}$ cm$^{-3}$ and the thickness of the barrier layer is set twice that of a quantum-well layer, the carrier density in the quantum-well layer reaches 3.0×10$^{19}$ cm$^{-3}$. The effect can be obtained in the case where an impurity is doped in at least part of each of the barrier layer and quantum-well layer.

The above description is made by example of the light emitting region of the quantum-well structure having the well layers and barrier layers; however, the first type semiconductor light emitting device of the present invention can be applied to a semiconductor light emitting device of a type in which optical guide regions or clad regions are directly joined to an active layer (equivalent to the well layer) by modifying the configuration thereof as follows:

The forbidden band width of a semiconductor layer forming an optical guide region or clad region (or a stacked structure of the semiconductor layers) is wider than that of an active layer, although the forbidden band width of the optical guide region is narrower than that of the cladding layer. An n-type impurity is doped in part of the junction interface side of each optical guide region or clad region joined to the active layer, to form a layer portion equivalent to the barrier layer. In a general semiconductor laser, there is adopted a configuration in which the conduction type of one of clad regions or optical guide regions disposed on both sides of an active layer is reversed to that of the other, or both the clad regions or optical guide regions are left undoped.

On the contrary, according to one embodiment of the present invention, the areas doped with the n-type impurity are formed in both the clad regions or optical guide regions. Such a configuration is slightly disadvantageous in terms of stimulated emission of laser light. However, the area doped with the n-type impurity is not required to be extended throughout each optical guide region or clad region but rather desired to be restricted only at a portion on the side of the junction interface with the active layer. In particular, in the case of adopting the so-called modulation-doped structure in which an impurity is not intended to be doped in the active layer, it may be desirable to suppress the thickness of the n-type impurity doped region at a value less than 10 nm for increasing the modulation-doping effect. As a result, there can be obtained an advantage that the release of carriers from the n-type impurity doped region in the active layer is promoted while the laser light stimulated emission effect is not obstructed. Further, the modulation-doping is effective to suppress separation of carriers in the active layer due to the piezoresistance effect, which separation is liable to be caused in a wurtzite type semiconductor light emitting device.

2-2: Relationship between Wurtzite Type Crystal Structure and Energy Band Structure Prior to description of the ground for creating the structures of the second type and third type semiconductor laser devices of the present invention, there will be described a relationship between a wurtzite type crystal structure and an energy band structure.

An image in which the oriented plane of a light emitting region (quantum-well active region) as the basic structure of the semiconductor laser device is taken as a plane inclined 70° to 90° from the (0001) plane will be described with reference FIGS. 3 to 5 each of which is a diagram showing the crystal structure of a gallium nitride based semiconductor crystal. In addition, FIG. 5 is the diagram illustrating plane orientation indices of the <lattice> of the wurtzite type crystal structure, that is, a hexagonal system.

FIG. 3 shows an arrangement of atoms in a gallium nitride based semiconductor crystal having the wurtzite type structure as one kind of the hexagonal system. In this figure, a hexagonal column portion defined by a thick broken line designates a unit cell of the crystal. The conventional gallium nitride based semiconductor crystal is epitaxially grown with the (0001) plane shown by the hatch lines rising rightwardly (more specifically, plane parallel thereto) taken as the growth plane. On the contrary, in the structure of the second type semiconductor light emitting device of the present invention, as is apparent from the above-described inclination angle range, a crystal plane perpendicular to the (0001) plane or a crystal plane inclined ±20° (±25° including the above-described tolerance) from the above upright crystal plane on the (0001) plane side is taken as the growth plane.

To be more specific, in the second type semiconductor light emitting device of the present invention, for example, the (1,0,–1,0) plane shown by the hatch lines rising leftwardly in FIG. 3, and a plane 1 parallel thereto are taken as growth planes in the light emitting region, particularly, the active layer. The above inclination angle range [only, a half (0 to +20°) range is shown] with respect to the (1,0,–1,0) plane in the second type semiconductor light emitting device of the present invention is shown as a region surrounded by two thick one-dot broken lines in FIG. 4. In addition, FIG. 4 is a diagram seen from an arrow A of FIG. 3 (an image seen in the direction along the plane 1).

The ground for creating the configuration of the second type semiconductor light emitting device of the present invention will be described below by way of the example in which the (1,0,–1,0) plane is taken as the growth plane of the light emitting region.

FIGS. 6A to 6D each show an energy dispersion in the upper portion of the valence band in the case where the oriented plane of a quantum-well layer (active layer) is taken as the (1,0,–1,0) plane. The strained amounts in the states shown in FIGS. 6A to 6C are as follows: $e_a=e_c=0\%$ for the state shown in FIG. 6A; $e_a=e_c=0.5\%$ (compressive strain) for the state shown in FIG. 6B; and $e_a=e_c=0.5\%$ (extension strain) for the state shown in FIG. 6C. Here, $e_a$ and $e_c$ are strained amounts within a quantum-well plane and are defined by $$e_a=(a-a_0)/a$$
$$e_c=(c-c_0)/c$$

where a and c are lattice constants of the well layer in the quantum-well active region along the a-axis and c-axis, respectively, and $a_0$ and $c_0$ are lattice constants of the well layer of the quantum-well active region along the a-axis and c-axis in the state in which no biaxial stress is applied to the well layer, respectively.

For comparison, the energy dispersion for the quantum-well layer in which the oriented plane is taken as the (0001) plane is shown in FIG. 6D.

In FIGS. 6A to 6D, the abscissas kx, ky, and kz designate crystal orientations [1,0,–1,0], [–1,2,–1,0], and [0001], respectively. The transparent carrier density required for light emission of the optical device is substantially dependent on one, called first sub-band, of a plurality of curves (indicating the band structures) which appear on each graph. The sub-bands are ranked in the order of increasing of the energy at the center (point of k =0) of each graph. In FIGS. 6A, 6B and 6D, the curve HHI becomes the first sub-band, and in FIG. 6C, the curve LH1 becomes the first sub-band. The effect of the sub-bands lower than the first sub-band exerted on the transparent carrier density is substantially negligible. The first sub-band exerts an effect on the threshold carrier density as follows. First, an effective mass m* of carriers (positive holes in this case) is obtained by secondary differentiation of an energy E of the first sub-band with respect to the wave number k as expressed by the following equation (1):

$$m^*=h/(2\pi d^2E/dk^2) \quad (1)$$

A state density D(E) of a two-dimensional system has a relationship with the value m* thus obtained as expressed by the following equation (2):

$$D(E)=4\pi m^*/(Lzh^2) \quad (2)$$

In the above equations, h designates the Planck's constant and Lz designates the thickness of the quantum-well layer. The transparent carrier density is substantially dependent on the state density D(E), and accordingly, as is apparent from the equation (2), the reduction in effective mass of carriers leads to a reduction in injected amount of carriers required for light emission, that is, threshold carrier density.

As is apparent from comparison between FIGS. 6A and 6D, in the case where the oriented plane of the quantum-well layer is taken as the (1,0,–1,0) plane, the symmetry of the crystal is lost, so that the effective mass of the heavy positive hole band (HH1) shown as the first sub-band is reduced to about two-third that in the case where the orientated plane is taken as the (0001) plane. Also as shown in FIG. 6B, in the case where the compressive strain ($e_a=e_c$) is applied to the quantum-well layer, the valence band is split so that the non-parabolic shape of the first sub-band in the upper portion of the valance band is improved. As the degree of necking at the shoulder of the first sub-band is reduced and the first sub-band becomes a curve similar to a parabola, the width of the gain spectrum becomes narrower, which results in an advantage in increasing the gain. Further, as shown in FIG. 6C, in the case where the extension strain is applied to the quantum-well layer, light positive hole band (LH1) is shifted upwardly to be taken as the first sub-band, with a result that the effective mass is increased. The result of applying each of the quantum-well layers thus examined to a semiconductor laser device is shown in FIG. 7. In this figure, the curve designated by [(1,0,–1,0) unstrained] is equivalent to the quantum-well layer shown in FIG. 6A; the curve [(1,0,–1,0) 0.5% comp.] is equivalent to the quantum-well layer shown in FIG. 6B; the curve [(0001) unstrained] is equivalent to the quantum-well layer shown in FIG. 6D; and the curve [(0001) 0.5% comp.] is equivalent to a quantum-well layer in which 0.5% compressive strain is applied to the state of the quantum-well layer shown in FIG. 6D.

The data shown in FIG. 7 are obtained for a quantum-well active region composed of quantum-well layers made from GaN and barrier layers made from $Al_{0.2}Ga_{0.8}N$. In this figure, like FIG. 1, the abscissa designates the injected carrier density and the ordinate designates the optical gain.

As is apparent from comparison between FIGS. 1 and 7, by combining the structures of the first type and second type semiconductor light emitting devices of the present invention with each other, the curve indicating the optical gain increasing linearly with the injected carrier is further shifted on the left side. This means that the threshold carrier density is further reduced. Further, as described above, the doping of the impurity in the active layer region is effective to suppress separation of carriers due to the piezoresistance effect which is liable to be caused in a wurtzite type strained quantum-well.

In summary, by providing a laser including the quantum-well layer having the (1,0,–1,0) growth plane, to which no strain or a compressive strain is applied, or the quantum-well layer having (grown along) an oriented plane: equivalent thereto in terms of energy, it is possible to reduce the state density in the upper portion of the valence band, and hence to realize laser oscillation at a low threshold value.

Here, the oriented plane equivalent to the (1,0,–1,0) plane in terms of energy means any one of all crystal planes perpendicular to the (0001) plane. That is to say, in the configuration of the second device of the present invention, plane indices (called Miller indices) of the planes having the above inclination angle of 90° are not limited. The reason for this is due to the isotropy of energy within a kx-ky plane in the wave number space (specifically, the (0001) plane or a plane parallel thereto) in a semiconductor material having the wurtzite type crystal structure. For example, the (1,1,-2,0) growth plane is equivalent to the (1,0,-1,0) growth plane in terms of energy.

Next, the ground why the inclination angle is restricted in the range of 3° to 70° or the range of 70° to 90° will be described.

FIG. 8 shows the results of theoretically calculating a relationship between an inclination angle and an effective mass of positive holes in the case where the growth plane of an active layer is inclined from the (0001) plane to the (1,0,-1,0) plane. The curve designated by "unstrained" shows data obtained in the case of the quantum-well active layer region, and the curve designated by "strained" shows data obtained in the case of the strained quantum-well active layer region. In other words, the curve "unstrained" shows the data in the case of $e_a=e_c=0$. As shown in FIGS. 6A and 6B, the state of the band structure in the case of $e_a=e_c=0$ is substantially similar to that in the case of $e_a=e_c=$compressive strain. Accordingly, it may be considered that the dependence of the inclination angle on the effective mass in the case where the quantum-well active layer is left unstrained ($e_a=e_c=0$) is similar to that in the case where the quantum-well active layer has the compressive strain ($e_a=e_c=$ compressive strain). In the strained quantum-well structure shown in FIG. 8, the lattice unconformity between the well layer and barrier layer is 1.0% along the a-axis and 1.6% along the c-axis, that is, the compressive stress is applied to the well layer. To be more specific, the curve "strained" shows the data for the strained quantum-well structure having the compressive strain of $e_c=1.6\%$ and $e_a=1.0\%$.

The results of FIG. 8 shows that in the case of "unstrained", the effective mass at an inclination ranging from 70° to 90° becomes two-third that at an inclination of 0°, that is, in the case of (0001) plane; while in the case of "strained", the effective mass at an inclination ranging from 10° to 70° becomes one-second to two-third that at an inclination of 0°. Further, as is apparent from FIG. 8, in the case of the strained quantum-well structure, the effective mass of positive holes at an inclination angle near 40° becomes one-second that at an inclination angle of 0°, that is, in the case of the (0001) plane.

Additionally, in this example, the quantum-well layer is made from GaN, and the width of the well is selected at 7 nm, 5 nm and 3 nm. Further, in the case of the strained quantum-well layer, the barrier layer is made from AlGaN (Al mol ratio: 40%). The effective mass of positive holes on the ordinate are relative values standardized by a bulk value within a plane perpendicular to the c-axis. The other quantum-well structures are also provided so as to exhibit specific characteristics.

On the basis of the above examination, the present inventors have found that the effect obtained when the growth plane of the above light emitting region, particularly, active layer is inclined 90° from the (0001) plane and the strained amount is specified as $e_c=e_a$ is also produced when the inclination angle is reduced to 65° and the range of the strained amount is specified as $e_c \leq 1.1 \times e_a$.

As a result, it has been found that the inclination angle is desirable to be set for each of the following two cases.

(1) In the case where the strained amount is specified as $e_c \leq 1.1 \times e_a$, the inclination angle is set in a range of 70° to 90°.

(2) In the case where the strained amount is specified as $e_c > 1.1 \times e_a$, the inclination angle is set in a range of 3° to 70°, preferably, 5° to 70°, more preferably, 10° to 70°.

And, on the basis of this knowledge as well as the knowledge associated with the isotropy of energy, it has been found that the above effect, that is, the reduction in threshold carrier density due to the reduction in effective mass of carriers can be achieved even if the growth direction is inclined in any plane orientation insofar as the inclination angle is set in the above-described angle range.

Further, according to the configuration of the present invention, the optical gain of the quantum-well active layer exhibits a large optical anisotropy. In the case of the strained amount specified as $e_c=e_a$, in the inclination angle range of 70° to 90°, since the band state at the top of the valence band becomes only the P-orbit component parallel to the (0001) plane, the transition probability can be made twice that in the conventional quantum-well in which the oriented plane is taken as the (0001) plane by taking the end surface of the laser resonator as the (0001) plane or a plane equivalent thereto. In this case, since the gallium nitride based semiconductor crystal having the wurtzite type structure exhibits good cleavage along the (0001) plane, the laser resonator structure can be easily obtained by a cleavage method like the conventional semiconductor laser made from the zinc-blend type crystal. On the other hand, in the case of the strained amount specified as $e_c>1.1xe_a$, in the inclination angle range of 10° to 70°, since the band state at the top of the valence band becomes only the P-orbit component parallel to the (-1,2,-1,0) plane, the optical transition probability can be made twice that in the conventional quantum-well in which the oriented plane is taken as the (0001) plane by taking the end surface of the laser resonator as the (-1,2,-1,0) plane or a plane equivalent thereto.

A relationship between the crystal growth axial direction and the end surface of an optical resonator in a semiconductor laser device will be briefly described. In the case where the oriented plane is taken as the (0001) plane, the state of positive holes becomes a hybrid orbit of Px and Py, and accordingly, the polarization due to laser light cannot be efficiently formed For example, if the polarization direction of laser light is taken as the X-direction, the Py component does not contribute to the polarization. On the contrary, at a plane inclined from the (0001) plane, the P-orbit can be fixed in one axial direction. Accordingly, by selecting the polarization direction along such a direction, all of the positive holes can contribute to the polarization. In this case, the cleavage plane is required to be set in parallel to the polarization direction.

As described above, the reduction in threshold current value of a semiconductor light emitting device results from the reduction in effective mass of positive holes of a semiconductor material. Hereinafter, there will be supplementarily described the conception of such a phenomenon for a clearer understanding thereof.

As is apparent from the theory of solid-state physics, the reduction in effective mass of positive holes means that the state density of the valence band becomes small. In the case where a semiconductor laser device is configured using semiconductor stacked layers in such a state, it satisfies the laser oscillation condition at a small carrier density. This is an effect obtained mainly by a shear component of strain (shear strain).

The reason why the inclination of the crystal growth axis of a quantum-well semiconductor stacked layer structure leads to the reduction in effective mass of positive holes may be considered as follows. In the wurtzite type semiconductor crystal grown in the c-axis direction, the effective mass of positive holes is generally very large irrespective of the bulk state or quantum-well structure. This is due to the fact that the P-orbit component constituting the valence band is symmetric within a plane perpendicular to the c-axis (that is, within the x-y plane). FIG. 9 is a diagram of a band structure of the (0001) plane showing such a symmetric state. Referring to FIG. 9, since the X-state band is overlapped to the Y-state band, the effective mass of positive holes becomes large.

On the contrary, for the band structure of a plane other than the (0001) plane, the symmetry of each of the X-state band and Y-state band is lost. Since the X-state band and the Y-state band are separated from each other on the energy axis, the effective mass of positive holes is reduced. To be more specific, for the (0001) plane, the positive holes take two states in the Px and Py directions; however, for a plane inclined from the (0001) plane, the positive holes take only state in one direction. This means that the state density is reduced. In the case of the strained quantum-well, at a plane inclined from the (0001) plane, the symmetry is largely lost because shear strain is caused as described above. FIG. 10 shows an example of the band structure of a plane other than the (0001) plane.

As described above, the reduction in effective mass of carriers leads to the reduction in state density of carriers, this will be briefly, qualitatively described below. In general, the state density represents the number of states per unit volume and unit energy. In the case of the effective mass being large, the range of momentum per unit energy is wide. That is to say, since the effective mass of carriers is large, more roughly, since the carriers are heavy, the unit energy is not increased unless the momentum is increased. The wide range of momentum means that the carriers take various states of momentum. On the contrary, the reduction of the effective mass of the carriers makes narrower the range of momentum, that is, makes relatively smaller the possible states of momentum of the carriers.

The reason why the threshold current required for light emission is reduced by using a semiconductor material having such characteristics will be briefly described with reference to FIGS. 11A and 11B. In general, for a semiconductor material, the state density of electrons (conduction band) is smaller than the state density of positive holes (valence band). Accordingly, electrons are concentrated at the band end, that is, in a small momentum state, while positive holes are distributed even in a large momentum state because the state density of the positive holes is large as described above. Light emission occurs by emission combination of electrons and positive holes, and in this case, as is apparent from the theory of solid-state physics, the momentum is retained. Accordingly, the positive holes in the large momentum state become useless, to thereby increase the threshold current value required for light emission. FIG. 11A shows such a state.

On the other hand, by reducing the state density of the valence band to make it closer to that of the conduction band, the above useless state of the positive holes can be reduced. This is effective to increase the optical transition probability contributing to emission combination of electrons and positive holes, and hence to reduce the threshold current required for light emission. FIG. 11B shows such a state.

2-3: Second Type Semiconductor Light Emitting Device

The second type semiconductor light emitting device of the present invention will be described below. The definition of a light emitting region which may be configured as a quantum-well structure in the following description is the same as that described in the first type semiconductor light emitting device of the present invention.

As a first aspect of the second type semiconductor light emitting device of the present invention, there is provided a semiconductor light emitting device composed of at least compound semiconductors, the device including at least a first conduction type cladding layer; a second conduction type cladding layer; and an active layer region having a quantum-well structure, which region is put between the cladding layers and which has a well layer and barrier layers each having a forbidden band width larger than that of the well layer; characterized in that the oriented plane of the quantum-well active region is a plane inclined 70° to 90° from the (0001) plane or a plane equivalent thereto. In this case, as described above, the inclination angle may have a deviation, that is, a tolerance of 5° or less. Further, as described above, the tolerance is applied to inclination in the directions other than the inclination direction from the (0001) plane.

As one example for carrying out the above configuration, a semiconductor layer constituting the light emitting device is sometimes epitaxially grown on (upper portion of) a misoriented substrate. In general, the (0001) plane of a sapphire substrate having a hexagonal crystal structure is taken as a principal plane for expitaxial growth; however, in the case of adopting the misoriented substrate, a plane inclined a specific angle from the (0001) plane is taken as the principal plane for expitaxial growth The epitaxial growth using the misoriented substrate is good in quality of the grown crystal (crystallinity) and doping of an impurity upon growth of crystal, and in the case where the epitaxial growth using the oriented substrate is adopted for the present invention, the above inclination angle range is further allowed to have a tolerance of 5°. The tolerance of 5° can be applied to the case using no oriented substrate depending on the degree of reduction in required operational current, in consideration of a relationship between the angle of the expitaxial growth plane of an active layer and the threshold carrier density.

2-4: Third Type Semiconductor Light Emitting Device

The third type semiconductor light emitting device of the present invention will be described below. The definition of a light emitting region which may be configured as a quantum-well structure in the following description is the same as that described in the first type semiconductor light emitting device of the present invention.

As a first aspect of the third type semiconductor light emitting device of the present invention, there is provided a semiconductor light emitting device including at least a quantum-well active layer region made from a semiconductor material of a hexagonal system, characterized in that the crystal growth direction of the quantum-well active layer region is parallel to an axis which is inclined 3° to 70° from the [0001] axis (c-axis) or an axis equivalent thereto. As the hexagonal crystal, there may be preferably used a wurtzite type crystal.

The inclination angle may be in a range of 5° or more. Further, the inclination angle is preferably in a range of 5° to 70°, more preferably, 10° to 60°, and most preferably, 20° to 55°. The inclination angle will be more clearly apparent from the description of FIG. 8.

In the case of a semiconductor laser device adopting a strained quantum-well structure in which the crystal growth axis is specified in parallel to an axis inclined 20° to 55° from the [0001] axis (c-axis), the end surface of the laser resonator is preferably taken as the (−1, 2,−1,0) plane or a plane equivalent thereto.

Hereinafter, the selection of the crystal growth orientation of a quantum-well layer and the adoption of a reflection plane of a resonator in the case of a semiconductor laser device will be more concretely described.

Example of Selection of Crystal Growth Orientation of Quantum-well Layer (1) The semiconductor laser device includes at least a strained quantum-well active layer region made from a wurtzite type semiconductor material, wherein the crystal growth plane is taken as a plane which is inclined 3° or less or 5° or less from the (1,0,−1,N) plane (N=1, 2, or 3) or a plane equivalent thereto.

(2) The semiconductor laser device includes at least a strained quantum-well active layer region made from a wurtzite type semiconductor material, wherein the crystal growth plane is taken as a plane which is inclined 5° or less from the (−1,2,−1, N) plane (N=3, 4, or 5) or a plane equivalent thereto.

Hereinafter, the selection of the crystal growth orientation of a quantum-well layer and the adoption of a reflection plane of a resonator in the case of a semiconductor laser device will be more concretely described.

Example of Adoption of Reflection Plane of Resonator of Semiconductor Laser Device (1) A strained quantum-well active layer region constitutes part of the semiconductor laser resonator, and the end surface of the semiconductor laser resonator is parallel to a plane containing both a crystal growth axis in the strained quantum-well active layer region and the [0001] axis (c-axis).

(2) A quantum-well active layer region or strained quantum-well active layer region constitutes part of the semiconductor laser resonator, and the end surface of the semiconductor laser resonator is parallel to a plane containing both a crystal growth axis in the quantum-well active layer region or strained quantum-well active layer region and the [0001] axis (c-axis), and is equivalent to the (−1,2,−1.0) plane.

(3) A quantum-well active layer region or strained quantum-well active layer region constitutes part of the semiconductor laser resonator, and the end surface of the semiconductor laser resonator is parallel to a plane containing both a crystal growth axis in the quantum-well active layer region or strained quantum-well active layer region and the [0001] axis (c-axis), and is equivalent to the (1,0,−1,0) plane.

2-5: Other Supplement Points of Semiconductor Light Emitting Device of the Present Invention In the case where the configuration of the above-described semiconductor light emitting device is applied to a surface emission type light emitting device, it is needless to say that a semiconductor laser device good in polarization characteristic can be obtained by the above-described effect.

In a typical example of each of the second type and third type semiconductor light emitting devices of the present invention, the crystal growth plane of a gallium nitride based semiconductor is inclined from the (0001) plane, and accordingly, it may be considered that the crystal plane of a principal substrate is required to be matched with the crystal growth plane. However, there have been reported experimental data in which the GaN crystal with the (1,−1,0,0) plane taken as the growth plane is grown on the (0001) principal plane of a SiC substrate and the GaN crystal with the (1,1,−2,0) plane taken as the growth plane is grown on the (1,−1,0,2) principal plane of a sapphire substrate. Accordingly, the crystal growth plane of a gallium nitride based semiconductor is not required to be matched with the plane index of the principal crystal plane of a substrate.

While the structure of each of the second type and third type semiconductor light emitting devices of the present invention has been described with reference to the example using the light emitting region of the quantum-well structure, such a structure is not limited to the light emitting region of the quantum-well structure. The present invention can be applied, for example, to the case where the light emitting region is configured as a single active layer joined to optical guide layers or cladding layers.

A gallium nitride based semiconductor crystal applied to each of the first type, second type and third type semiconductor light emitting devices of the present invention will be additionally described below. The semiconductor material is the group III–V compound semiconductor which necessarily contains nitrogen (N). In the above description, the group III–V compound semiconductor is called the gallium nitride based semiconductor for convenience; however, it does not necessarily contain gallium (Ga) as the group III element but may contain at least one kind selected from the group III elements such as aluminum (Al), gallium and indium (In). Further, with respect to the group V elements, the group III–V compound semiconductor may contain not only nitrogen (N) but also other group V elements such as phosphorous (P), arsenic (As) and antimony (Sb). That is to say, the compound semiconductor of the present invention represented by a gallium nitride based semiconductor may be called a III–V compound semiconductor containing at least nitrogen or nitride semiconductor.

As the semiconductor material forming the quantum-well structure, there may be used a wurtzite type semiconductor material represented by a gallium nitride based semiconductor which is expressed by a general structural formula of $In_xAl_yGa_{1-x-y}N_{1-a-b}As_aP_b$, where $0 \leq x \leq 1, 0 \leq y \leq 1, 0 \leq a < 1, 0 \leq b < 1, x+y \leq 1$, and $a+b<1$.

The active layer is preferably made from CaN, InGaN, InGaAlN, GaNP, GaNAs, InGaNP, InGaNAs, GaAlNP or GaAlNAs. The well layer is preferably made from GaN or InGaN. The clad is typically made from GaAlN, AlN, GaN or InGaAlN.

The thickness of each of the well layer or barrier layer for the quantum-well semiconductor stacked structure may be the same as that of the conventional one. In general, the thickness of the well layer is in a range of 2 nm to 15 nm, and the thickness of barrier layer is in a range of 3 nm to 15 nm. Preferably, the thickness of the well layer is in a range of 2 nm to 8 nm, and the thickness of the barrier layer is in a range of 4 nm to 8 nm.

In the preferable quantum-well active layer composed of the well layer and barrier layers, the lattice constant of the well layer is larger than that of the barrier layer, and a compressive strain is applied to the well layer. The lattice constant of the strained well layer is desirable to be larger than that of the unstrained well layer by 0.6% to 2.0%.

The substrate for formation of such a semiconductor stacked body may be made from a material on which the wrutzite type crystal can be grown, for example, sapphire, GaN, spinel, SiC, ZnO, MgO, MnO, $SiO_2$, or AlN. In particular, the sapphire substrate or GaN substrate is preferably used.

In manufacture of a semiconductor light emitting device, the known means may be used insofar as the above-described configuration of the present invention is satisfied. For example, a buffer layer for improving the crystallinity may be provided between a substrate for crystal growth and a quantum-well semiconductor stacked layer structure in accordance with the known method. Also, the withdrawal of an electrode from an insulating sapphire substrate, provision of a so-called contact layer for forming another electrode withdrawn from an upper portion of the semiconductor stacked layer structure, or formation of a layer inserted optionally for improving the crystallinity may be performed in accordance with the known method. It should be understood that such additional configurations and modified configurations fall within the scope of the present invention.

In addition, such a semiconductor stacked layer structure can be of course used, in addition to a semiconductor light emitting device, other semiconductor devices required for reducing the effective mass of positive holes.

BEST MODE FOR CARRYING OUT THE INVENTION

The mode for carrying out the present invention will be described in detail by way of embodiments with reference to the drawings.

<First Embodiment>

Description will be made of optical information processing equipment typically configured as a photomagnetic disk apparatus.

Figure 12:
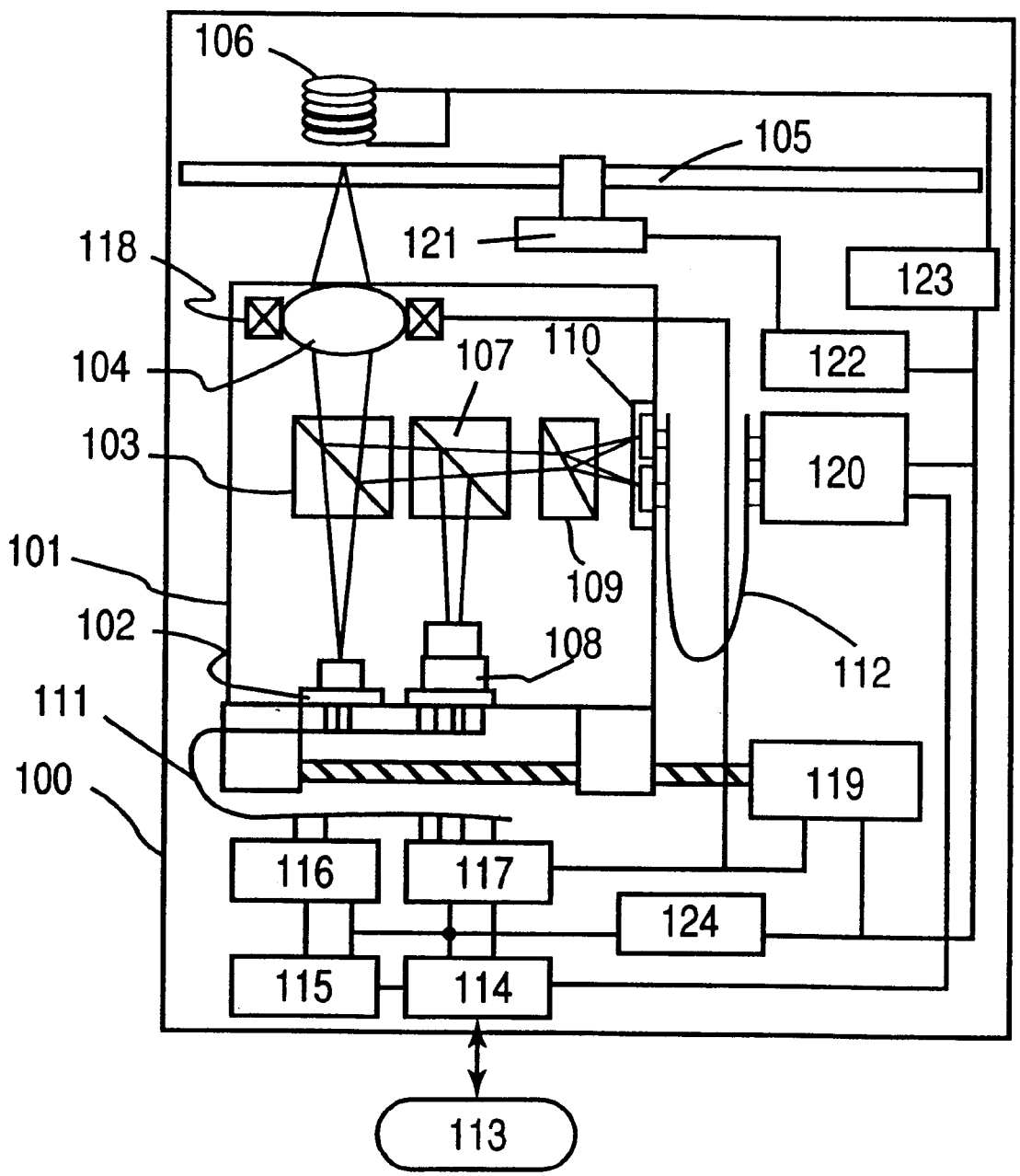
FIG. 12 is a schematic diagram illustrating a photomagnetic recording apparatus.

First, the general configuration of a photomagnetic disk apparatus will be schematically described. FIG. 12 is a schematic configuration view showing one example of a photomagnetic disk apparatus. A photomagnetic disk apparatus 100 is basically composed of an optical head 101, a control circuit, and a mechanical system including, for example, a motor.

First, in the optical head 101, linearly polarized light emitted from a semiconductor laser device 102 passes through a light branching element 103 and is focused on an photomagnetic disk 105 through an objective lens 104. Upon reproducing of a signal, the polarization direction of the light reflected from the photomagnetic disk 105 is turned about 1° reversely depending on whether or not a light spot is located on a recording domain, to carry recording information. Upon recording of a signal, a magnetic field applying coil 106 applies to the photomagnetic disk 105 a magnetic field in the direction reversed to the previously initialized magnetization direction of the photomagnetic disk 105, to reverse the magnetization of only a region whose temperature has been increased to a temperature higher than a transition temperature (Curie point) of a magnetic recording film by irradiation of light spot, thereby forming a magnetic domain.

The light reflected from the photomagnetic disk 105 passes through the objective lens 104 again, being reflected from the light branching element 103, and enters a second light branching element 107. First, the light reflected from the second light branching element 107 enters a servo-signal detecting photo detector 108. At the photo detector 108, a plurality of signals necessary for computing an out-of-focus signal and a tracking error signal are detected from the light by split photo detectors contained in the photo detector 108. On the other hand, the light having passed through the second light branching element 107 is separated, by a polarized light separating element 109, into linearly polarized light components inclined +45° and −45° from the polarization direction of the linearly polarized light having entered the photomagnetic disk 106, which light components enter two split photo detectors 110. Accordingly, in the case of no-turn of the polarized light by the photomagnetic disk, the quantities of the two linearly polarized light components are equal to each other; and in the case of turn of the polarized light, the above two light quantities are increased/decreased depending on the turning direction thereof. That is to say, a difference between outputs from the two split photo detectors becomes a photomagnetic reproducing signal.

The electric input or output into or from the optical head 101 is performed via flexible substrates 111 and 112. In this embodiment, the drive of the semiconductor laser device 102 and the input or output into or from the servo-signal detector 108 are performed via the flexible substrate 111, and the input or output into or from the two split photo detectors 110 is performed via the flexible substrate 112.

The semiconductor laser 102 controls the flickering of the light by a laser drive circuit 116 on the basis of a recording waveform. The recording waveform is created by a recording waveform creating circuit 115 in accordance with digital information supplied from a buffer memory 114 for storing user data 113 and is supplied to the laser drive circuit 116 therefrom.

The current output from the servo-signal detecting photo detector 108 is subjected to current-voltage conversion and amplification by a servo-signal computing circuit 117, to create an out-of-focus signal, a tracking error signal, and a head position control signal. The above two error signals are fed back to an objective lens actuator 118. The objective lens actuator 118 performs closed loop control on the basis of the error signals such that the focused light spot is usually located at an information track on the recording film plane of the photomagnetic disk 1105. On the other hand, the head position control signal is inputted in a head moving mechanism 119 in order that the optical head 101 is located substantially in the vicinity of a reproducing track. For a photomagnetic disk for recording digital information, the head moving mechanism 119 generally performs closed loop control; however, for a CD, DVD or MD, it often performs opened loop control.

The two split photo detectors 110, each of which is generally configured to contain an amplifier, output voltage signals into a signal detecting circuit 120 via the flexible substrate 112, being processed in terms of differential amplification, equalization, conversion into binary form, and decoding, to thus reproduce digital information. The output information is stored in the buffer memory 114.

The photomagnetic disk 105 is rotated by a spindle motor 121. The rotation of the photomagnetic disk 105 is controlled by a spindle motor drive circuit 122. The magnetization direction of the photomagnetic disk 105 is controlled by a magnetic field applying coil control circuit 123. In addition, the above control circuits are all controlled by a controller 124.

In this embodiment, as the semiconductor laser device 102, there was prepared the following one (#1, #2, or #3). Either of the semiconductor laser devices (#1, #2, and #3) is allowed to sufficiently achieve the object of the present invention.

|  | Semiconductor laser device (#1) | semiconductor laser device (#2) | semiconductor laser device (#3) |
|---|---|---|---|
| wavelength (nm) | 350–550 | 350–550 | 350–550 |
| threshold current (mA) | 8 | 11 | 6 |
| threshold current density (kA/cm$^2$) | 1.0 | 1.2 | 0.8 |
| slope efficiency | 0.3–0.4 | 0.4–0.5 | 0.4 |
| temperature characteristic | 120 K | 130 K | 120 K |
| oscillation delay time | 1 ns or less | 2 ns | 1 ns or less |
| polarization | TE mode | TE mode | TE mode |

Each of the above light sources is capable of realizing: emission of light having a wavelength in a range of 350 nm to 550 nm; a threshold current density of the light source in a range of 2.2 kA/cm$^2$ or less; and a recording density of the above recording medium in a range of 15 GB or more.

To achieve the object of the present invention, the threshold current density of the above light source is preferably in a range of 1.0 kA/cm$^2$ or less, more preferably, in a range of 0.8 kA/cm$^2$ or less, and further the threshold current is preferably in a range of 10 mA or less.

Figure 13:
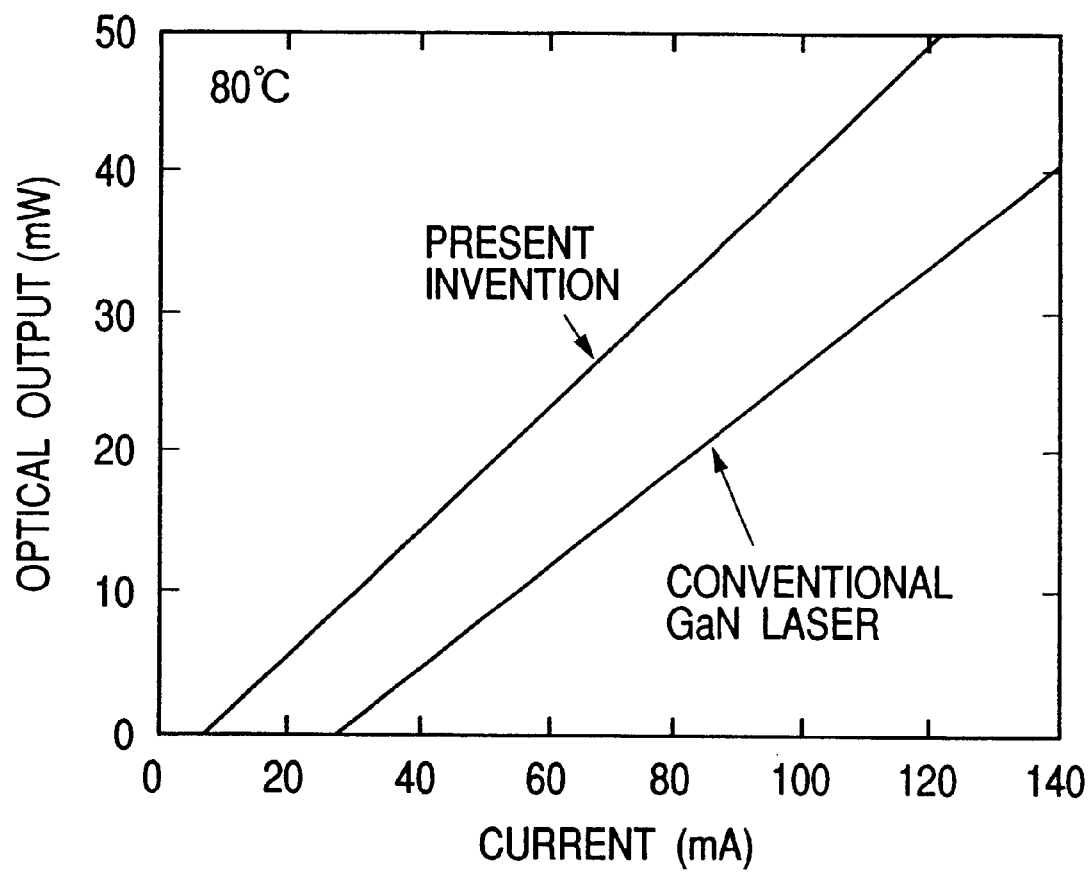
FIG. 13 is a diagram showing a relationship between an operational current and an optical output.

FIG. 13 is a diagram showing a relationship between an operational current and an optical output as a result of using, in this embodiment, a semiconductor laser device of the present invention and, alternatively, a conventional semiconductor laser device. From this diagram, it will be understood that the semiconductor laser device of the present invention is superior to the conventional one.

Hereinafter, configuration examples of semiconductor laser devices applicable to this embodiment will be described.

FIRST EXAMPLE

Figure 14:
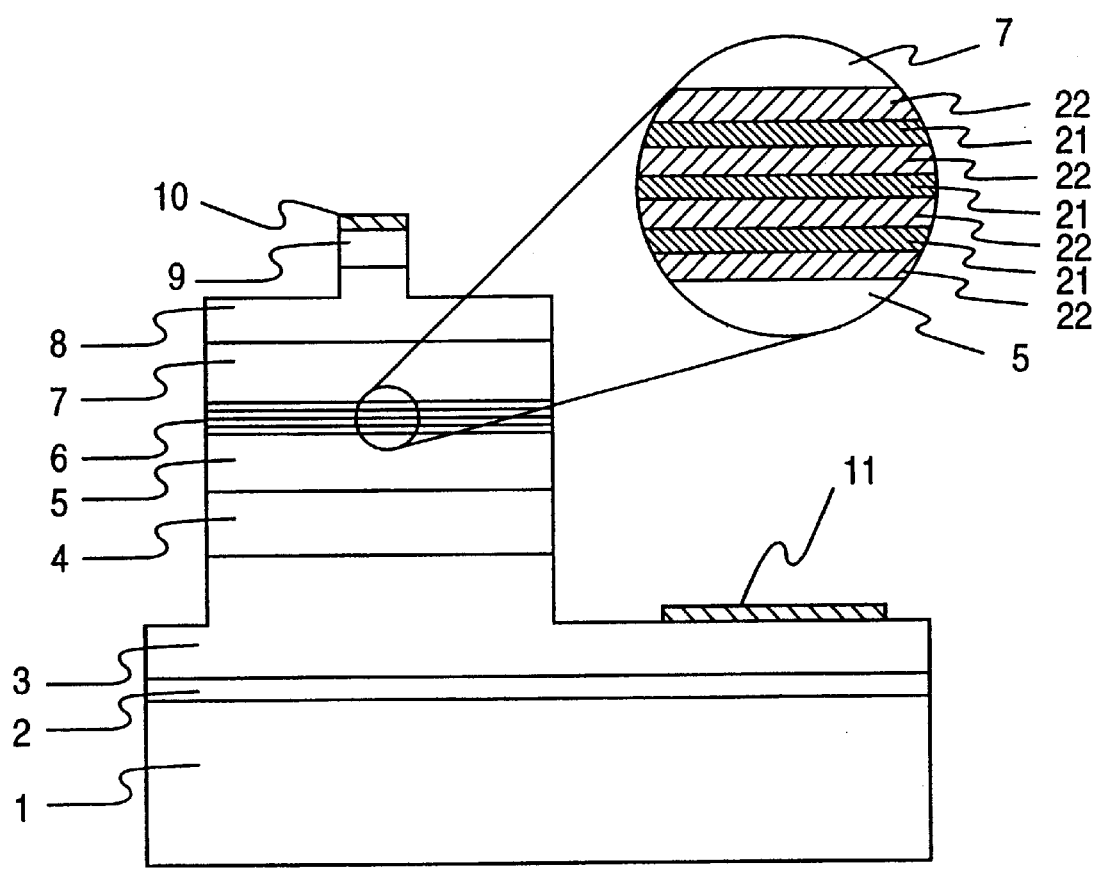
FIG. 14 is a sectional view of a semiconductor laser device according to one embodiment of the present invention.

FIG. 14 is a structural sectional view, seen from a plane crossing an optical axis, showing a semiconductor laser device as a first example of the present invention.

The semiconductor laser device having a multi-quantum well structure in this example is formed by sequentially stacking, on a sapphire substrate 1 with the (0001) plane taken as the principle plane thereof, a low temperature buffer layer 2 made from n-type GaN, a high temperature buffer layer 3 made from n-type GaN, an n-type Al$_{0.2}$Ga$_{0.8}$N cladding layer 4, an n-type GaN optical guide layer 5, a GaInN multi-quantum well active region 6, a p-type GaN optical guide layer 7, a p-type Al$_{0.2}$Ga$_{0.8}$N cladding layer 8, and a p-type GaN cap layer 9. Each of these layers is formed by epitaxial growth by the usual metal organic vapor phase epitaxial growth method. The thickness of each layer is set at 0.05 $\mu$m (low temperature buffer layer 2), 3 $\mu$m (high temperature buffer layer 3), 0.3 $\mu$m (n-type cladding layer 4), 0.1 $\mu$m (n-type optical guide layer 5), 0.1 $\mu$m (p-type optical guide layer 7), 0.3 $\mu$m (p-type cladding layer 8), and 0.5 $\mu$m (cap layer 9).

The multi-quantum well active region 6, as shown on the enlarged scale, has a multi-quantum well structure in which three pieces of undoped Ga$_{0.85}$In$_{0.15}$N well layers 21 each having a thickness of 2 nm and three pieces of n-doped Ga$_{0.95}$In$_{0.05}$N barrier layers 22 each having a thickness of 2 nm are alternately stacked to each other.

Here, the density of the impurity doped in the barrier layer 22 is set such that the density of electrons released from the impurity and locally present in the well layer becomes $3 \times 10^{19}$ cm$^{-3}$. A difference $\Delta Eg$ in band gap energy between the cladding layer and quantum-well layer is set at 0.8 ev. Next, the stacked structure on the substrate 1 is annealed at a temperature ranging from 400 to 800° C. for 20 to 60 min for activating the p-type layers. Then, as shown in FIG. 14, parts of the each grown semiconductor layers are subjected to dry-etching, to form a ridge stripe having a width of 2 $\mu$m. The ridge stripe structure is useful for current constriction and more useful for reduction in threshold value. To form an n-type electrode, the n-type GaN buffer layer 3 is exposed. Subsequently, a metal film made from Au or Al is formed, followed by patterning, to form both a p-side electrode 10 and an n-side electrode 11. Then, the growth layers are subjected to dry-etching from the upper side, so that the resonance plane is formed into a resonator length of 400 $\mu$m. In general, a plurality of semiconductor laser devices are formed on one wafer, and accordingly, the stacked structure on the substrate 1 is separated into respective laser devices by dicing. In the semiconductor laser device thus obtained, continuous oscillation was realized at a threshold current of about 8 mA at room temperature and the oscillation wavelength was about 405 nm.

SECOND EXAMPLE

A semiconductor laser device in this example of the present invention will be described with reference, also, to FIG. 14.

The semiconductor laser device having a multi-quantum well structure in this example is formed by sequentially stacking, on a sapphire substrate 1 with the (1,0,–1,2) plane taken as the principle plane thereof, a low temperature buffer layer 2 made from n-type GaN, a high temperature buffer layer 3 made from n-type GaN, an n-type $Al_{0.2}Ga_{0.8}N$ cladding layer 4, an n-type GaN optical guide layer 5, a GaInN multi-quantum well active region 6, a p-type GaN optical guide layer 7, a p-type $Al_{0.2}Ga_{0.8}N$ cladding layer 8, and a p-type GaN cap layer 9. Each of these layers is formed by epitaxial growth by the usual metal organic vapor phase epitaxial growth method. The thickness of each layer is set at 0.05 $\mu$m (low temperature buffer layer 2), 3 $\mu$m (high temperature buffer layer 3), 0.3 $\mu$m (n-type cladding layer 4), 0.1 $\mu$m (n-type optical guide layer 5), 0.1 $\mu$m (p-type optical guide layer 7), 0.3 $\mu$m (p-type cladding layer 8), and 0.5 $\mu$m (cap layer 9).

The multi-quantum well active region 6, as shown on the enlarged scale, has a multi-quantum well structure in which three pieces of undoped $Ga_{0.85}In_{0.15}N$ well layers 21 each having a thickness of 2 nm and three pieces of undoped GaN barrier layers 22 each having a thickness of 4 nm are alternately stacked to each other. The oriented plane of the quantum-well is the (1,0,–1,0) plane. Here, the composition of the well layer 21 is set such that the displacement of the lattice constant from the lattice constant in the unstrained state becomes $e_a=0.85\%$, $e_c=0.9\%$, and a biaxial compressive strain is applied.

Next, the stacked structure on the substrate 1 is annealed at a temperature ranging from 400 to 800° C. for 20 to 60 min for activating the p-type layers. Then, as shown in FIG. 14, parts of the each grown semiconductor layers are subjected to dry-etching, to form a ridge stripe having a width of 2 $\mu$m To form an n-type electrode, the n-type GaN buffer layer 3 is exposed. Subsequently, a metal film made from Au or Al is formed, followed by patterning, to form both a p-side electrode 10 and an n-side electrode 11. In general, a plurality of semiconductor laser devices are formed on one wafer, and accordingly, the stacked structure on the substrate 1 is cleaved into resonators each having a length of 400 $\mu$m along the (0001) plane, followed by formation of a coating on end surfaces thereof for improving reflection index, to manufacture semiconductor laser devices.

In the semiconductor laser device thus obtained, continuous oscillation was realized at a threshold current of about 11 mA at room temperature and the oscillation wavelength was about 405 nm.

THIRD EXAMPLE

Figure 15:
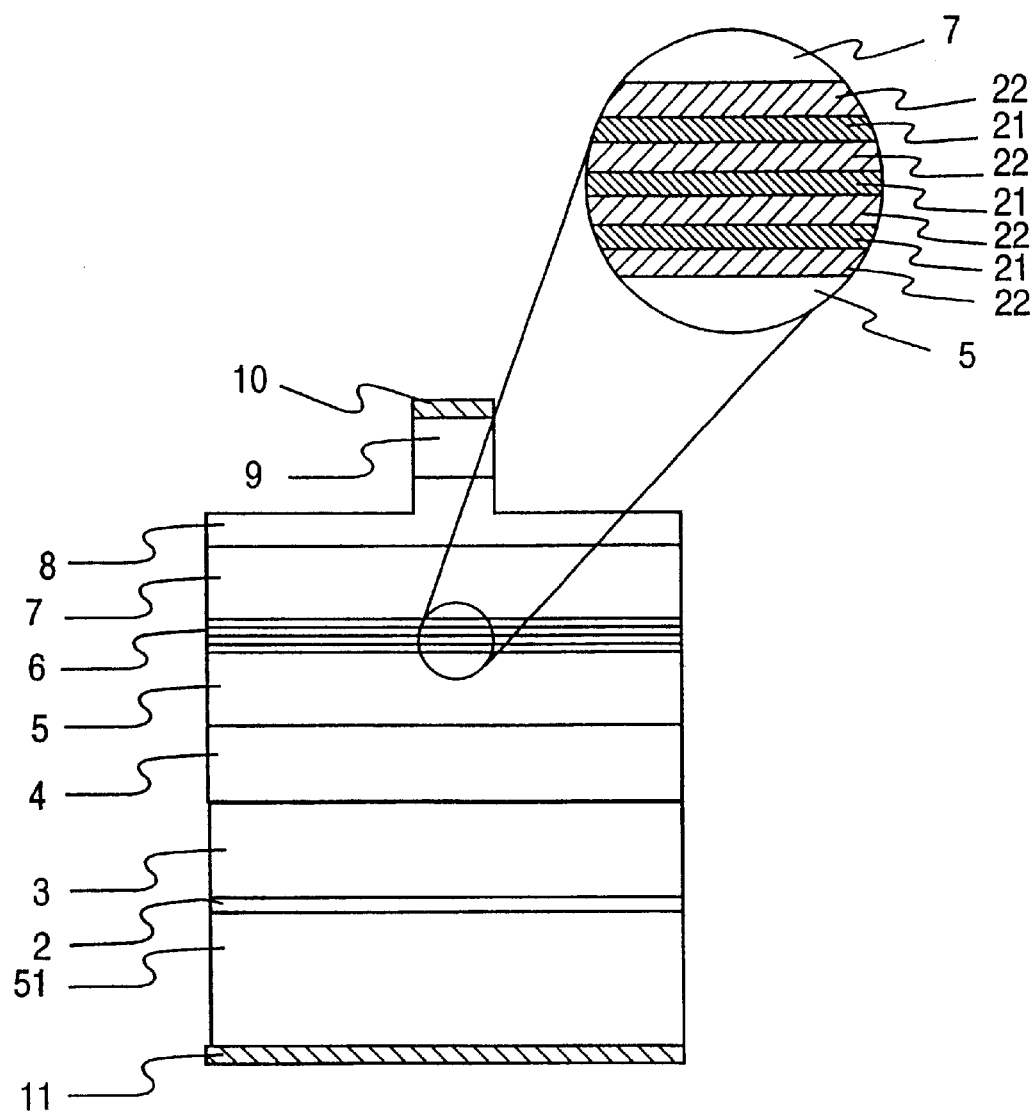
FIG. 15 is a sectional view of a semiconductor laser device according to one embodiment of the present invention.

FIG. 15 is a structural sectional view, taken from a plane crossing an optical axis, showing a semiconductor laser device as a third example of the present invention.

The semiconductor laser device having a multi-quantum well structure in this example is formed by sequentially stacking, on an n-type SiC substrate 51 with the (1,0,–1,0) plane taken as the principle plane thereof, a low temperature buffer layer 2 made from n-type GaN, a high temperature buffer layer 3 made from n-type GaN, an n-type $Al_{0.2}Ga_{0.8}N$ cladding layer 4, an n-type GaN optical guide layer 5, a GaInN multi-quantum well active region 6, a p-type GaN optical guide layer 7, a p-type $Al_{0.2}Ga_{0.8}N$ cladding layer 8, and a p-type GaN cap layer 9. Each of these layers (and region) is formed by epitaxial growth by the usual metal organic vapor phase epitaxial growth method. The thickness of each layer is set at 0.05 $\mu$m (low temperature buffer layer 2), 3 $\mu$m (high temperature buffer layer 3), 0.3 $\mu$m (n-type cladding layer 4), 0.1 $\mu$m (n-type optical guide layer 5), 0.1 $\mu$m (p-type optical guide layer 7), 0.3 $\mu$m (p-type cladding layer 8), and 0.5 $\mu$m (cap layer 9).

The multi-quantum well active region 6, as shown on the enlarged scale, has a multi-quantum well structure in which three pieces of undoped $Ga_{0.85}In_{0.15}N$ well layers 21 each having a thickness of 2 nm and three pieces of n-doped $Ga_{0.95}In_{0.05}N$ barrier layers 22 each having a thickness of 4 nm are alternately stacked to each other.

Here, the density of the impurity doped in the barrier layer 22 is set such that the density of electrons released from the impurity and locally present in the well layer becomes $4.0 \times 10^{19}$ cm$^{-3}$. The oriented plane of the quantum-well is the (1,0,–1,0) plane. Here, the composition of the well layer 21 is set such that the displacement of the lattice constant from the lattice constant in the unstrained state becomes $e_a=0.85\%$, $e_c=0.9\%$, and a biaxial compressive strain is applied. The biaxial strain means a strain caused by a stress applied to crystal lattices of different kinds of crystal layers resulting from a difference between both crystal lattices at an interface at which the different kinds of crystal layers are bonded to each other, which strain may be simply called "strain" or "lattice strain". A difference $\Delta Eg$ in band gap energy between the cladding layer and quantum-well layer is set at 0.8 eV. Next, the stacked structure on the substrate 1 is annealed at a temperature ranging from 400 to 800° C. for 20 to 60 mm for activating the p-type layers.

Then, part of the growth layers are subjected to dry-etching, to form a ridge stripe having a width of 2 $\mu$m.

Subsequently, a metal film made from such as Au or Al is formed, followed by patterning, to form both a p-side electrode 10 and an n-side electrode 11. The stacked structure on the substrate 1 is then cleaved into resonators each having a length of 400 $\mu$m along the (0001) plane, followed by formation of a coating on end surfaces thereof for improving reflection index, to manufacture semiconductor laser devices.

In the semiconductor laser device thus obtained, continuous oscillation was realized at a threshold current of about 6 mA at room temperature and the oscillation wavelength was about 410 nm.

<Second Embodiment>

One example of optical information processing equipment of a type making use of a state transition such as a phase transition of a recording medium will be described.

Figure 16:
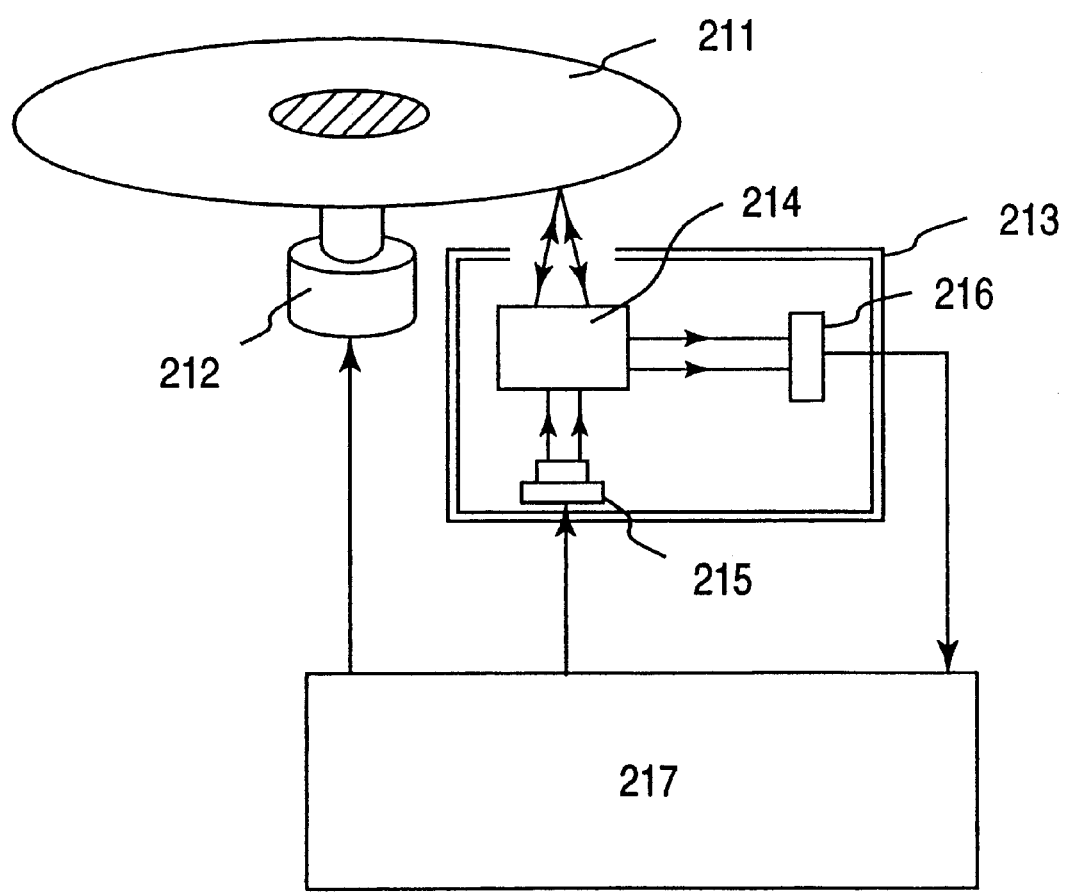
FIG. 16 is a schematic view illustrating an optical recording apparatus.

FIG. 16 is a basic configuration view showing one example of an optical disk apparatus. Reference numeral 211 designates a disk on which an optical recording medium for optical recording is provided; 212 is a motor for rotating the disk; 213 is an optical pickup; and 217 is a control unit for controlling these components. The optical pickup 213 has a lens system 214, a light source 215 such as a semiconductor laser device, and a photo detector 216.

The general configurations of such an optical disk apparatus have been variously reported, and therefore, only an important configuration will be briefly described. The optical disk apparatus is basically classified into a read-only type, a write once/read many times type, and rewritable type depending on the kind of a recording material.

The reproducing of information is performed by optically reading changes in light reflected from micro-holes (state change portions of recording medium) recorded in the disk 211 by the photo detector 216. In addition, the optical disk apparatus can be operated using the usual optical recording medium.

In the case of the read-only type, information is previously recorded in a recording medium of a read-only type, which medium is typically made from aluminum or a plastic material.

In recording information, the state of a recording material is thermally changed by modulating laser light, to perform recording in a row. The recording is performed with the disk rotated (moved) by the motor. As such a light source, the light source of the present invention can be used.

As the light source of such an optical disk apparatus, the semiconductor laser device shown in each of the examples in the first embodiment can be used, and also a semiconductor laser device to be manufactured in accordance with the following embodiments 3 to 9 can be used.

At present, the wavelength of a semiconductor laser device used for an optical disk apparatus is generally in a range of 630 nm or more. In general, the recording density of an optical disk is proportional to the square of the inverse of the wavelength of light emitted from the light source. Accordingly, the practical use of a blue-color based, blue-violet color based, or violet color based semiconductor laser device having an oscillation wavelength typically in a range of 430 nm to 550 nm according to the present invention allows realization of higher density recording of the optical disk apparatus. Further, the reduction in threshold current of the semiconductor laser device according to the present invention contributes to the prolonged service life of the optical disk apparatus, and therefore, it is extremely advantageous from the viewpoint of practical use.

Each of the above light sources is capable of realizing: emission of light having a wavelength in a range of 350 nm to 550 nm; a threshold current density of the light source in a range of 2.2 kA/cm$^2$ or less; and a recording density of the above recording medium in a range of 15 GB or more.

To achieve the object of the present invention, the threshold current density of the above light source is preferably in a range of 1.0 kA/cm$^2$ or less, more preferably, in a range of 0.8 kA/cm$^2$ or less, and further the threshold current is preferably in a range of 10 mA or less.

In this way, the optical information equipment of the present invention is capable of realizing higher recording density and higher reliability.

Hereinafter, a configuration example of a semiconductor laser device applicable to this embodiment will be described.

FOURTH EXAMPLE

A semiconductor laser device in this embodiment will be described with reference to FIG. 14.

The semiconductor laser device having a multi-quantum well structure in this example is formed by sequentially stacking, on a sapphire substrate 1 with the (1,0,−1,2) plane taken as the principle plane thereof, a low temperature buffer layer 2 made from n-type AlN, a high temperature buffer layer 3 made from n-type AlN, an n-type Al$_{0.2}$Ga$_{0.8}$N cladding layer 4, an n-type GaN optical guide layer 5, a GaInN multi-quantum well active region 6, a p-type GaN optical guide layer 7, a p-type Al$_{0.2}$Ga$_{0.8}$N cladding layer 8, and a p-type GaN cap layer 9. Each of these layers is formed by epitaxial growth by the usual metal organic vapor phase epitaxial growth method. The thickness of each layer is set at 0.05 µm (low temperature buffer layer 2), 3 µm (high temperature buffer layer 3 ), 0.3 µm (n-type cladding layer 4 ), 0.1 µm (n-type optical guide layer 5 ), 0.1 µm (p-type optical guide layer 7 ), 0.3 µm (p-type cladding layer 8 ), and 0.5 µm (cap layer 9).

The multi-quantum well active region 6, as shown on the enlarged scale, has a multi-quantum well structure in which three pieces of undoped Ga$_{0.85}$In$_{0.15}$N well layers 21 each having a thickness of 2 nm and three pieces of undoped GaN barrier layers 22 each having a thickness of 4 nm are alternately stacked to each other. The oriented plane of the quantum-well is the (1,0−1,2) plane. Here, the composition of the well layer 21 is set such that the displacement of the lattice constant from the lattice constant in the unstrained state becomes $e_a$=0.85%, $e_c$=1,4%, and a biaxial compressive strain is applied. Next, the stacked structure on the substrate 1 is annealed at a temperature ranging from 400 to 800° C. for 20 to 60 min for activating the p-type layers.

Then, part of the grown semiconductor layers are subjected to dry-etching to form a ridge stripe having a width of 2 µm. To form an n-type electrode, the n-type GaN buffer layer 3 is exposed. Subsequently, a metal film made from Au or Al is formed, followed by patterning, to form both a p-side electrode 10 and an n-side electrode 11. The stacked structure on the substrate 1 is cleaved into resonators each having a length of 400 µm along the (1,2,−1,0) plane, followed by formation of a high reflection coating, to manufacture semiconductor laser devices.

In the semiconductor laser device thus obtained, continuous oscillation was realized at a threshold current of about 10 mA at room temperature and the oscillation wavelength was about 412 nm.

<Third Embodiment>

Figure 17:
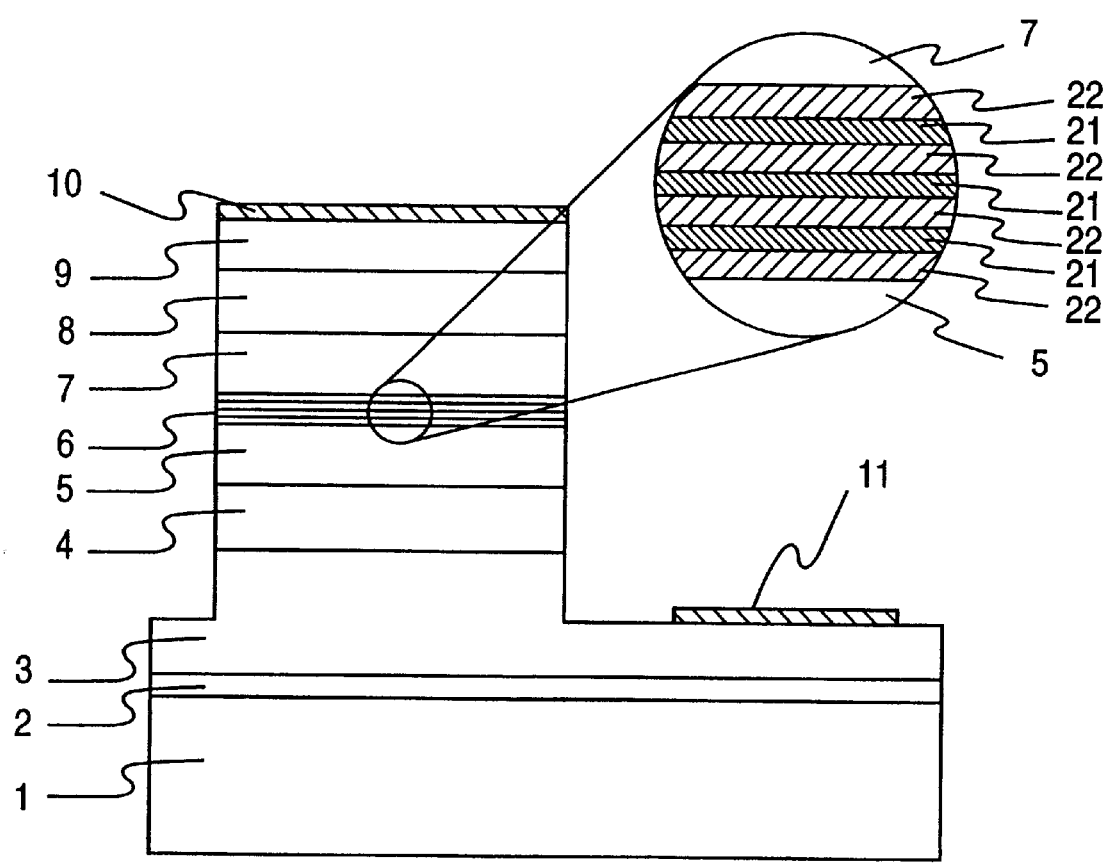
FIG. 17 is a sectional view of a semiconductor laser device according to one embodiment of the present invention.

FIG. 17 is a structural sectional view, taken from a plane crossing an optical axis, showing a semiconductor laser device in this embodiment.

The semiconductor laser device having a multi-quantum well structure in this embodiment is formed by sequentially stacking, on a sapphire substrate 1 with the (0001) plane taken as the principle plane thereof, a low temperature buffer layer 2 made from n-type GaN, a high temperature buffer layer 3 made from n-type GaN, an n-type Al$_{0.2}$Ga$_{0.8}$N cladding layer 4, an n-type GaN optical guide layer 5, a GaInN multi-quantum well active region 6, a p-type GaN optical guide layer 7, a p-type Al$_{0.2}$Ga$_{0.8}$N cladding layer 8, and a p-type GaN cap layer 9. Each of these layers is formed by epitaxial growth by the usual metal organic vapor phase epitaxial growth method. The thickness of each layer is set at 0.05 µm (low temperature buffer layer 2), 3 µm (high temperature buffer layer 3), 0.3 µm (n-type cladding layer 4), 0.1 µm (n-type optical guide layer 5), 0.1 µm (p-type optical guide layer 7), 0.3 µm (p-type cladding layer 8), and 0.5 µm (cap layer 9).

The multi-quantum well active region 6, as shown on the enlarged scale, has a multi-quantum well structure in which three pieces of undoped Ga$_{0.8}$In$_{0.2}$N well layers 21 each having a thickness of 3 nm and three pieces of n-doped Ga$_{0.95}$In$_{0.05}$N barrier layers 22 each being doped with an n-type impurity at the density of 2×10$^{19}$ cm$^{-3}$ and having a thickness of 5 nm are alternately stacked to each other.

Here, the density of the impurity doped in the barrier layer 22 is set such that the density of electrons released from the impurity and locally present in the well layer becomes 4.5×10$^{19}$ cm$^{-3}$. A difference ΔEg in band gap energy between the cladding layer and quantum-well layer is set at 0.8 eV.

Next, the stacked structure on the substrate 1 is annealed at a temperature ranging from 400 to 800° C. for 20 to 60 min for activating the p-type layers. Then, to form an n-type electrode, as shown in FIG. 15, part of the grown semiconductor layers are subjected to dry-etching, to expose the n-type GaN buffer layer 3. Next, a metal film made from such as Au or Al is formed, followed by patterning, to form both a p-side electrode 10 and an n-side electrode 11. In general, a plurality of semiconductor laser devices are formed on one wafer, and accordingly, the stacked structure on the substrate 1 is separated into respective laser devices by dicing.

In the semiconductor laser device thus obtained, continuous oscillation was realized at a threshold current of about 50 mA at room temperature and the oscillation wavelength was about 410 nm.

<Fourth Embodiment>

Figure 18:
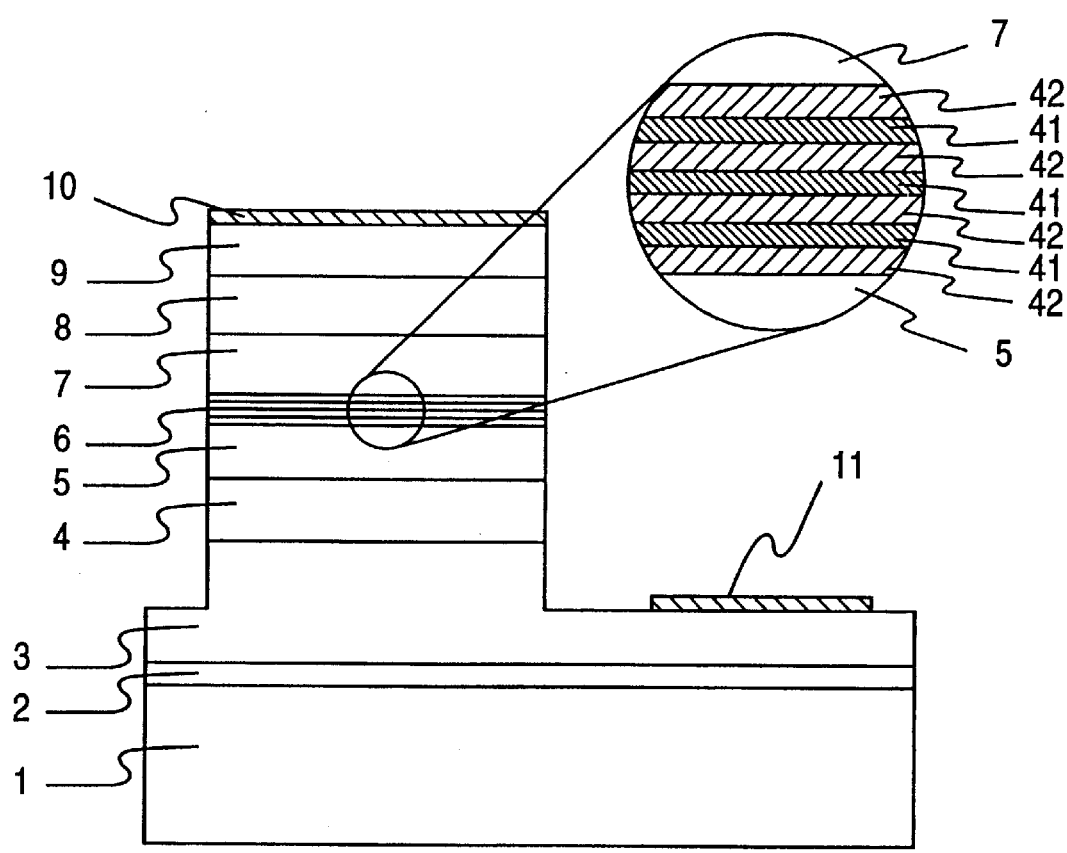
FIG. 18 is a sectional view of a semiconductor laser device according to one embodiment of the present invention.

FIG. 18 is a structural sectional view, taken from a plane crossing an optical axis, showing a semiconductor laser device in this embodiment.

The semiconductor laser device having a multi-quantum well structure in this example is formed by sequentially stacking, on a sapphire substrate 31 with the (1,0,−1,2) plane taken as the principle plane thereof, a low temperature buffer layer 2 made from n-type GaN, a high temperature buffer layer 3 made from n-type GaN, an n-type $Al_{0.2}Ga_{0.8}N$ cladding layer 4, an n-type GaN optical guide layer 5, a GaInN multi-quantum well active region 6, a p-type GaN optical guide layer 7, a p-type $Al_{0.2}Ga_{0.8}N$ cladding layer 8, and a p-type GaN cap layer 9. Each of these layers is formed by epitaxial growth by the usual metal organic vapor phase epitaxial growth method. The thickness of each layer is set at 0.05 $\mu$m (low temperature buffer layer 2), 3 $\mu$m (high temperature buffer layer 3), 0.3 $\mu$m (n-type cladding layer 4), 0.1 $\mu$m (n-type optical guide layer 5), 0.1 $\mu$m (p-type optical guide layer 7), 0.3 $\mu$m (p-type cladding layer 8), and 0.5 $\mu$m (cap layer 9).

The multi-quantum well active region 6, as shown on the enlarged scale, has a multi-quantum well structure in which three pieces of undoped $Ga_{0.8}In_{0.2}N$ well layers 41 each having a thickness of 4 nm and three pieces of undoped GaN barrier layers 42 each having a thickness of 6 nm are alternately stacked to each other. The oriented plane of the quantum-well is the (1,0,−1,0) plane. Here, the composition of the well layer 41 is set such that the displacement of the lattice constant from the lattice constant in the unstrained state becomes $e_a=1.0\%$, $e_c=1.1\%$, and a biaxial compressive strain is applied.

Figure 1:
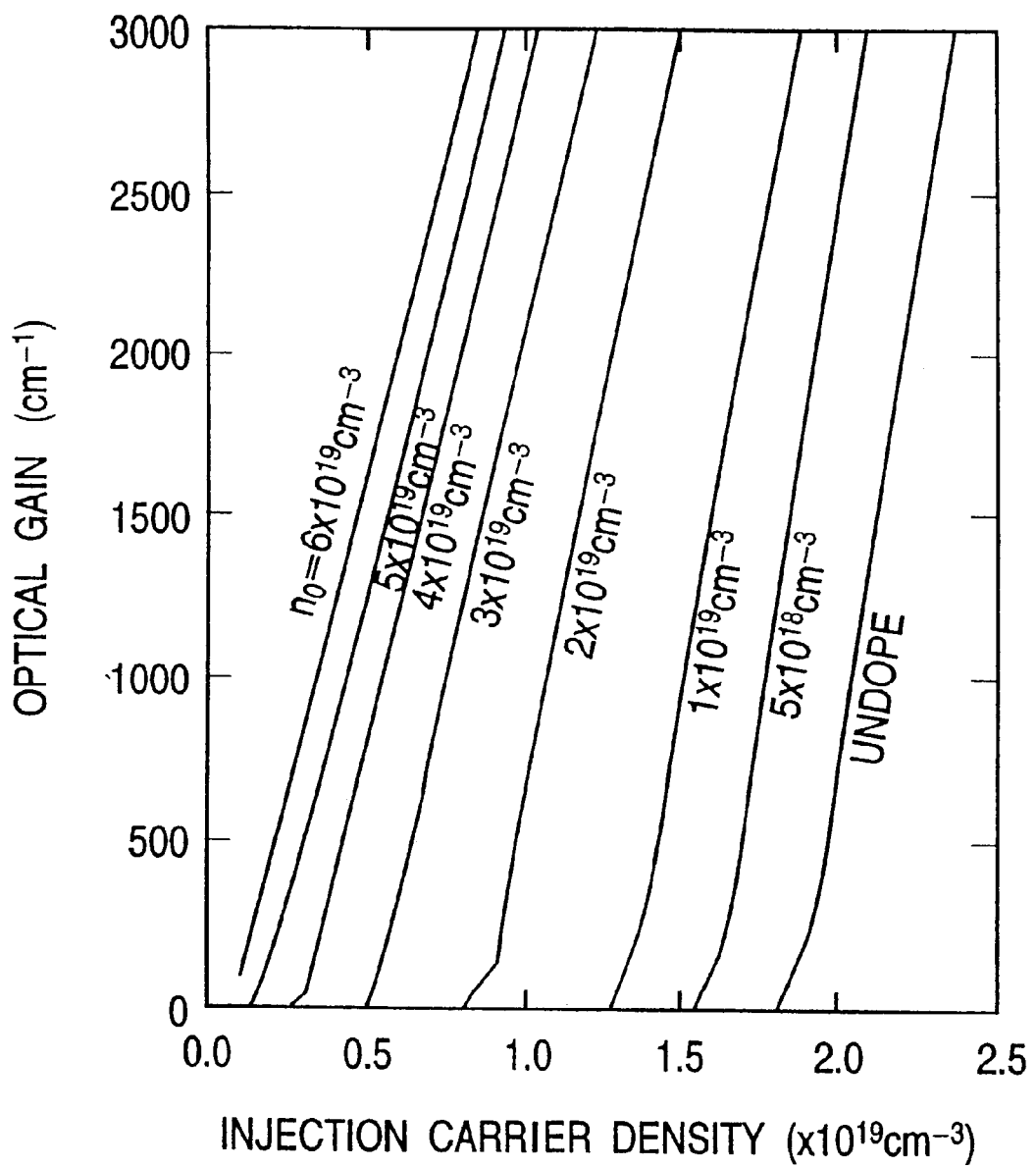
FIG. 1 is a diagram showing the dependence of the density of a modulation-doped impurity on the maximum gain in a GaN/AlGaN quantum-well.
Figure 2:
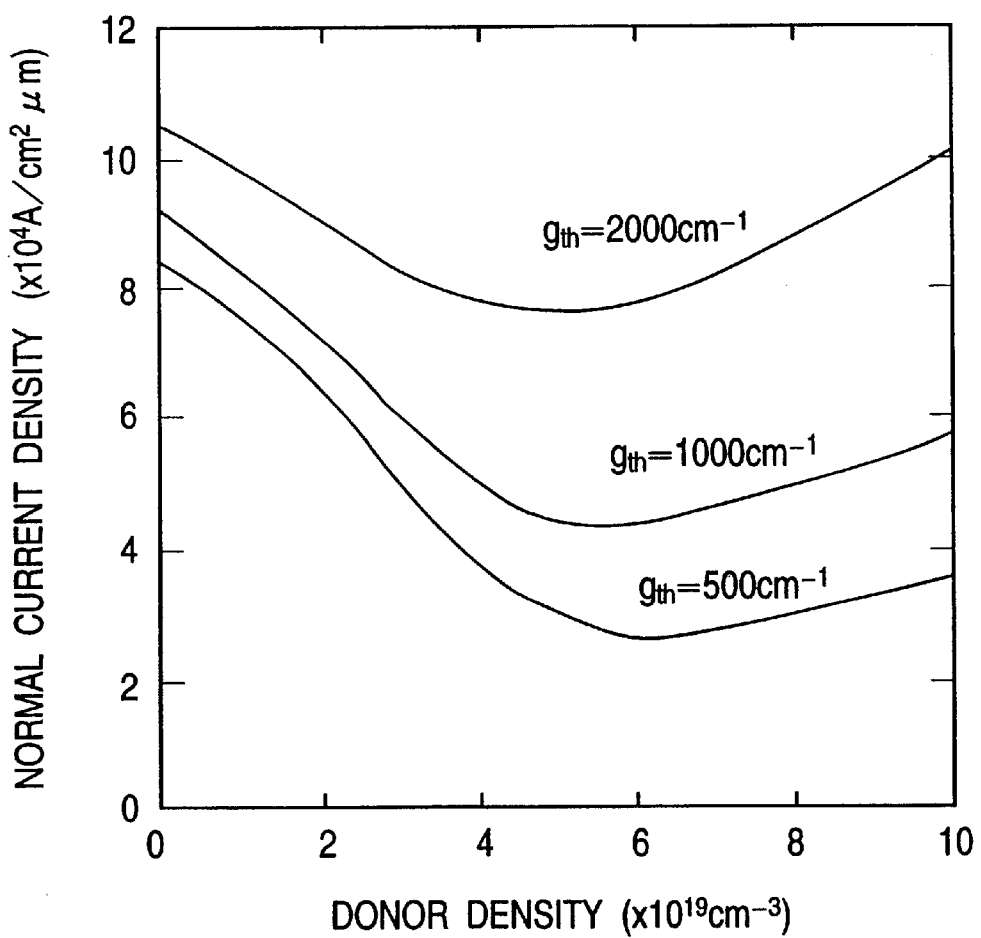
FIG. 2 is a diagram showing the dependence of the density of a modulation-doped impurity on a threshold current density in a GaN/AlGaN quantum-well.
Figure 3:
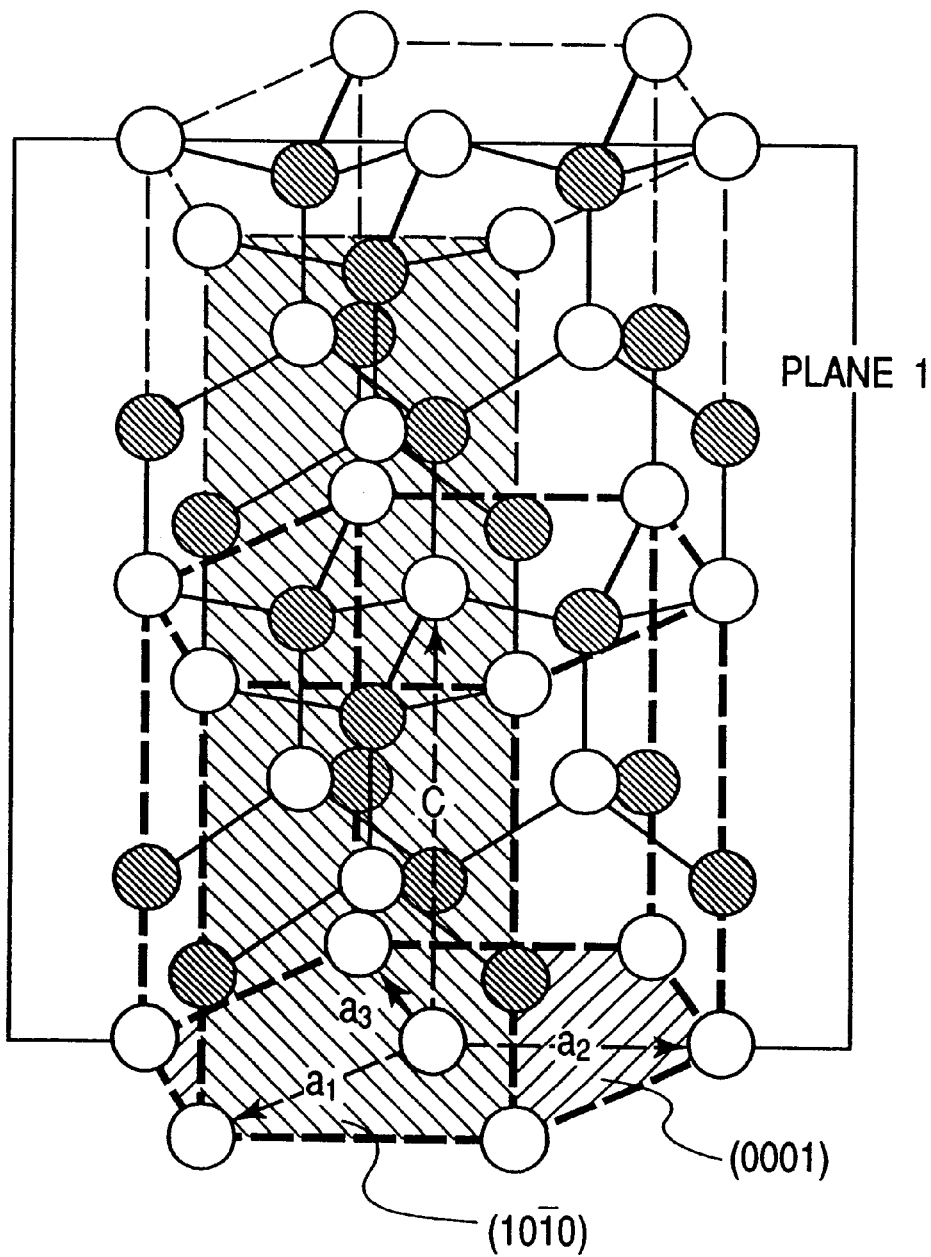
FIG. 3 is a diagram showing the structure of a gallium nitride based semiconductor crystal.
Figure 4:
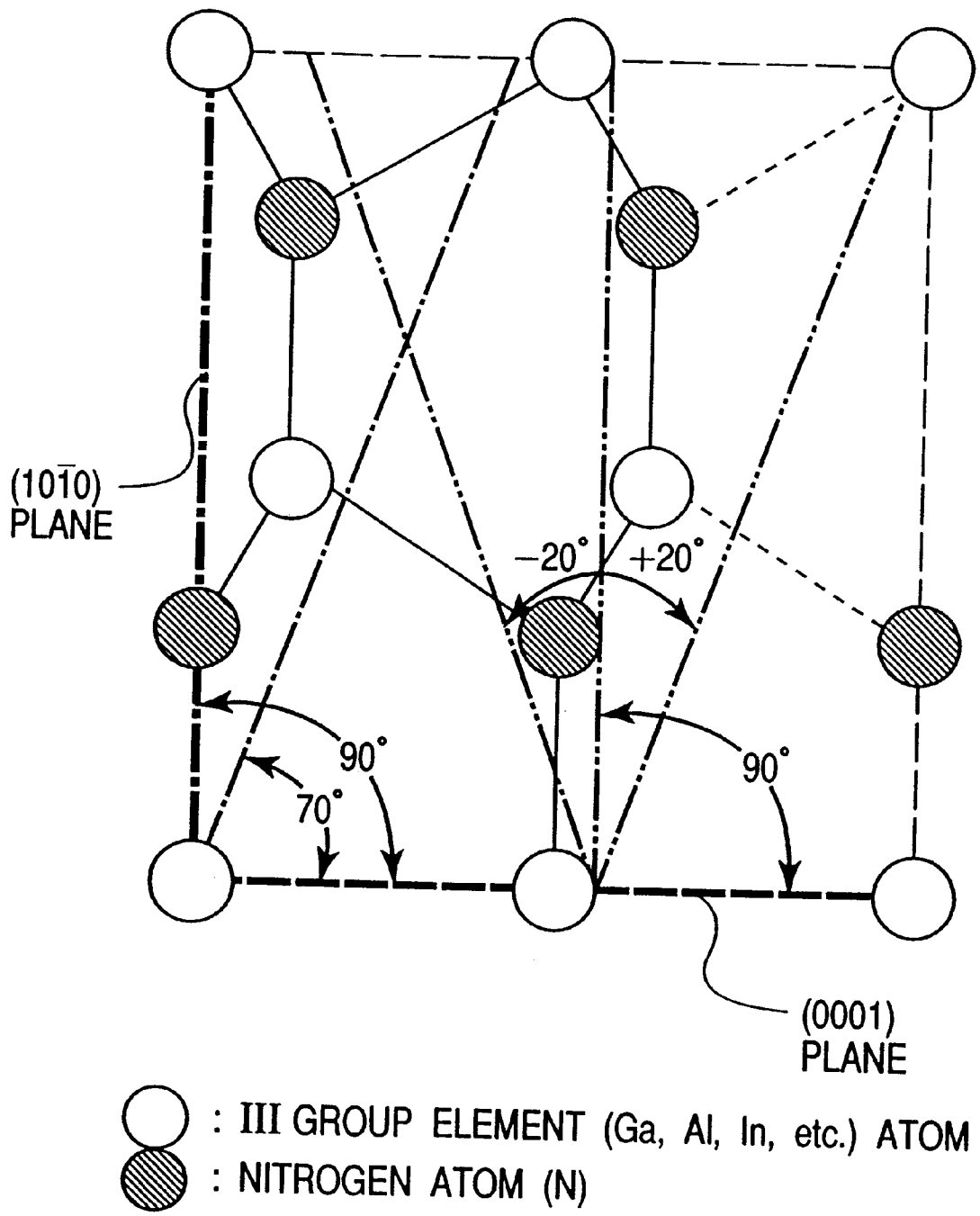
FIG. 4 is a diagram showing the growth plane of a gallium nitride based semiconductor crystal according to a second device configuration of the present invention.
Figure 5:
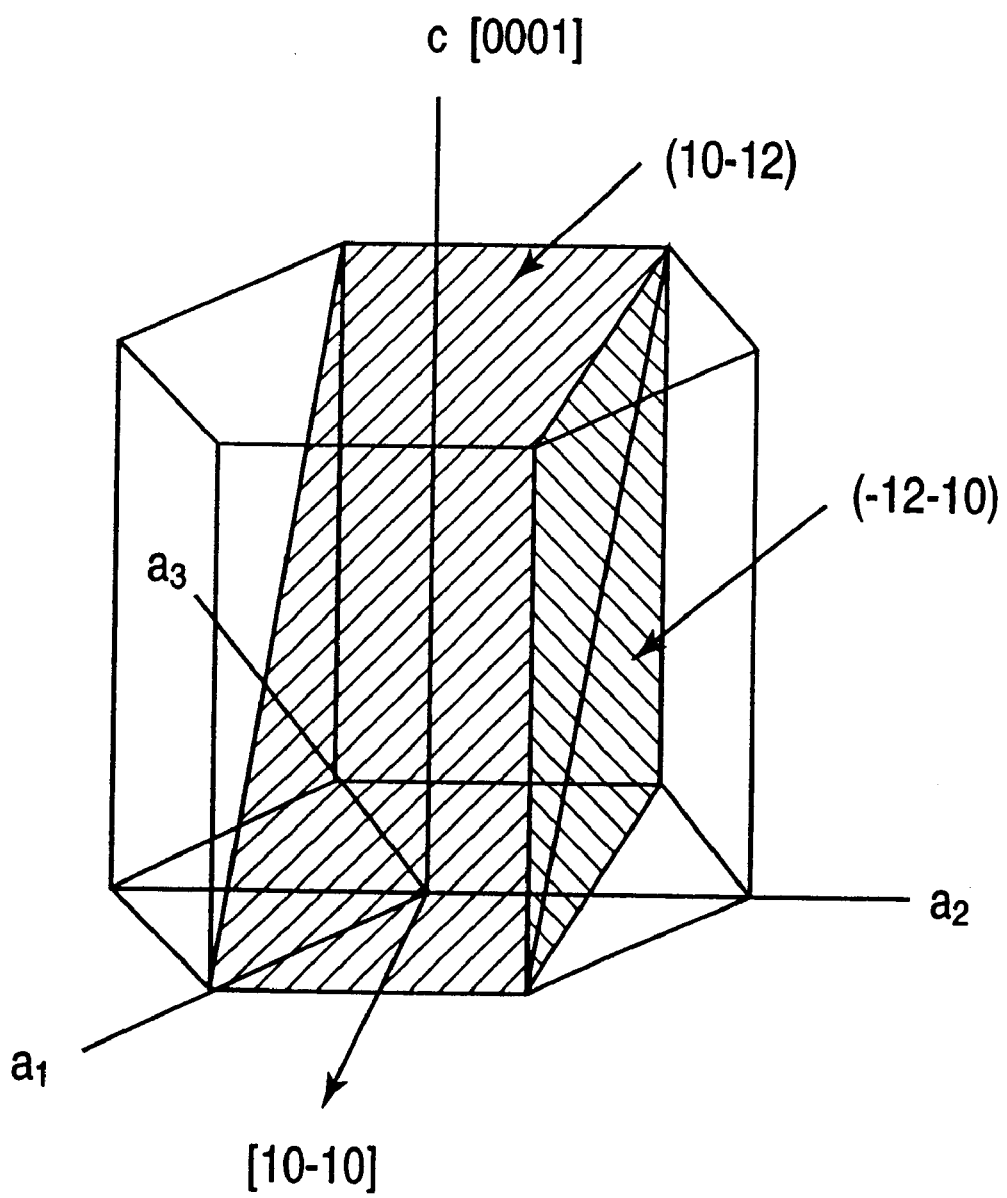
FIG. 5 is a diagram illustrating plane orientation indices of a hexagonal lattice.
Figure 6A:
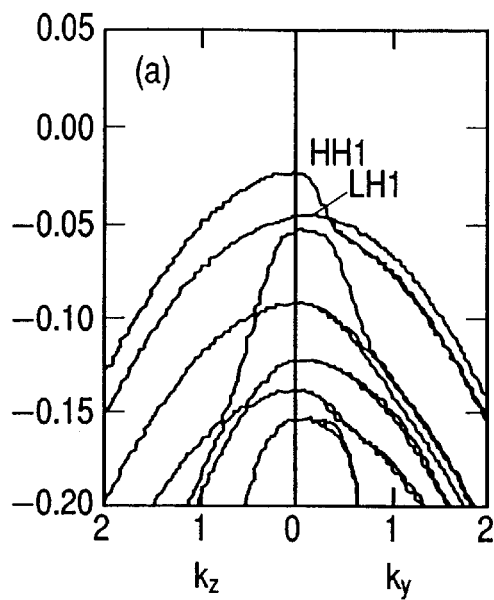
FIGS. 6A, 6B, 6C and 6D are diagrams each showing energy dispersion in the upper portion of a valence band in a GaN/AlGaN quantum-well with the oriented plane taken as the (1,0,−1,0) plane.
Figure 6B:
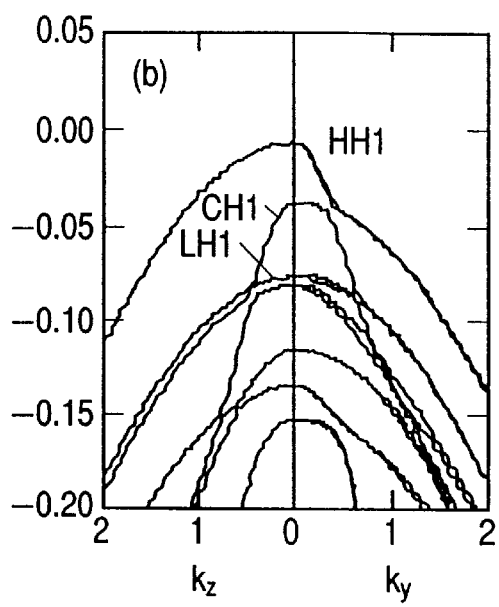
Figure 6C:
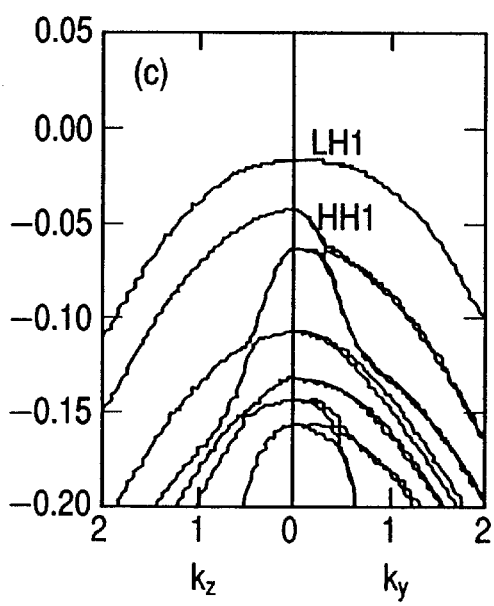
Figure 6D:
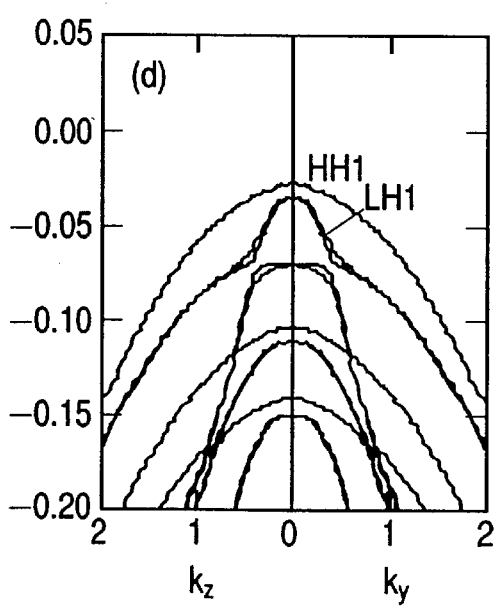
Figure 7:
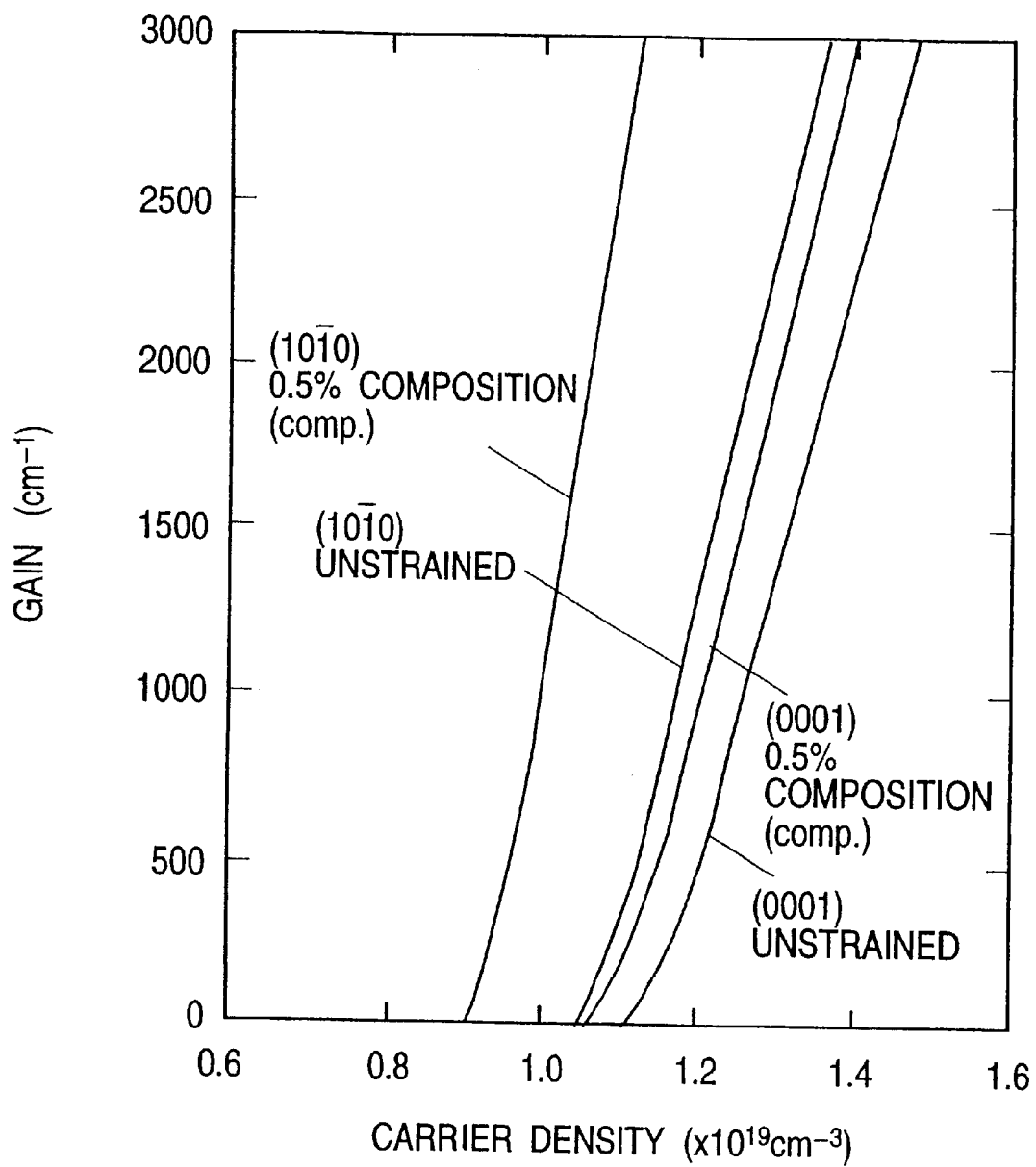
FIG. 7 is a diagram showing a relationship among a crystal growth plane, lattice strain, and optical gain in a GaN/AlGaN quantum-well active region.
Figure 8:
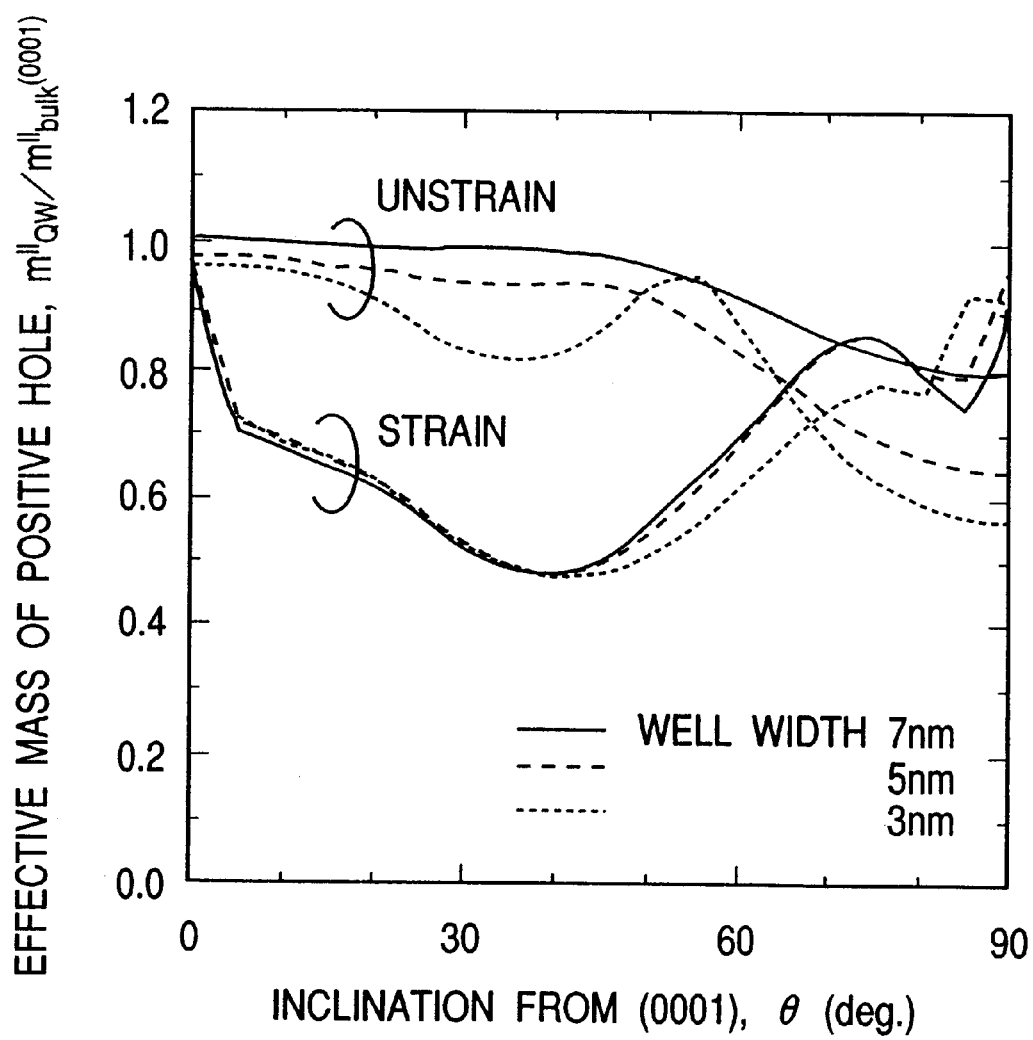
FIG. 8 is a diagram showing the results of theoretically calculating a relationship between the effective mass of positive holes and an inclination angle from the (0001) plane.
Figure 9:
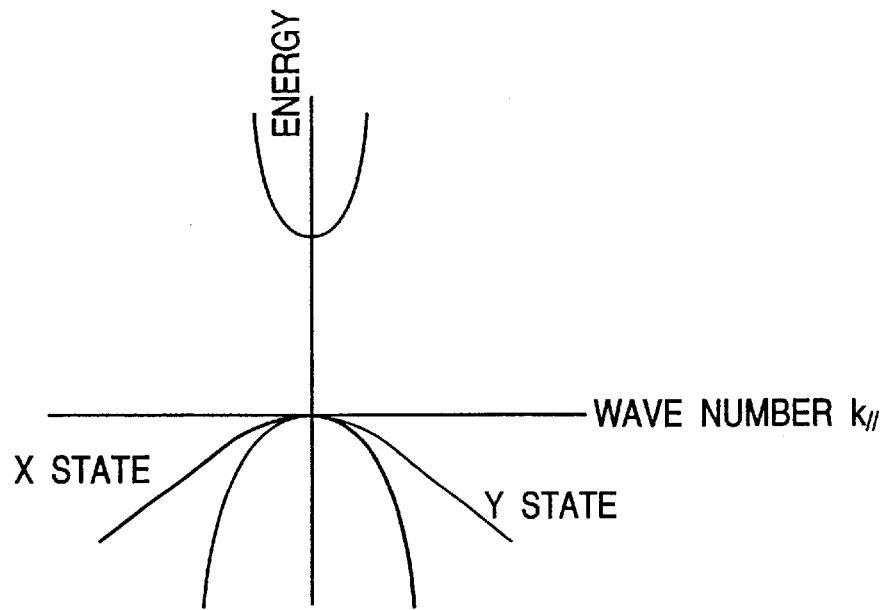
FIG. 9 is a diagram showing a band structure of a semiconductor material.
Figure 10:
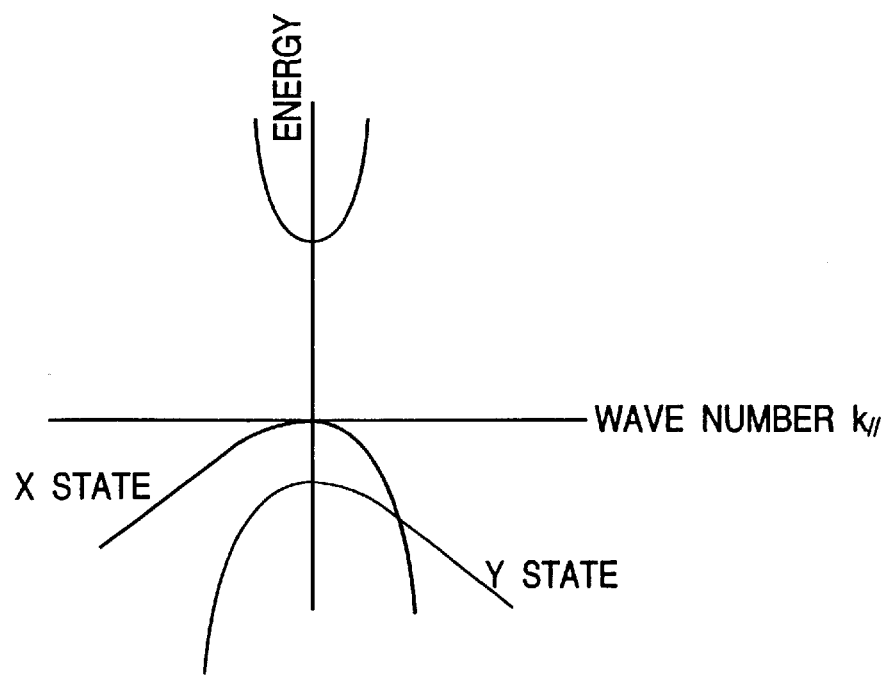
FIG. 10 is a diagram showing another band structure of a semiconductor material.
Figure 11A:
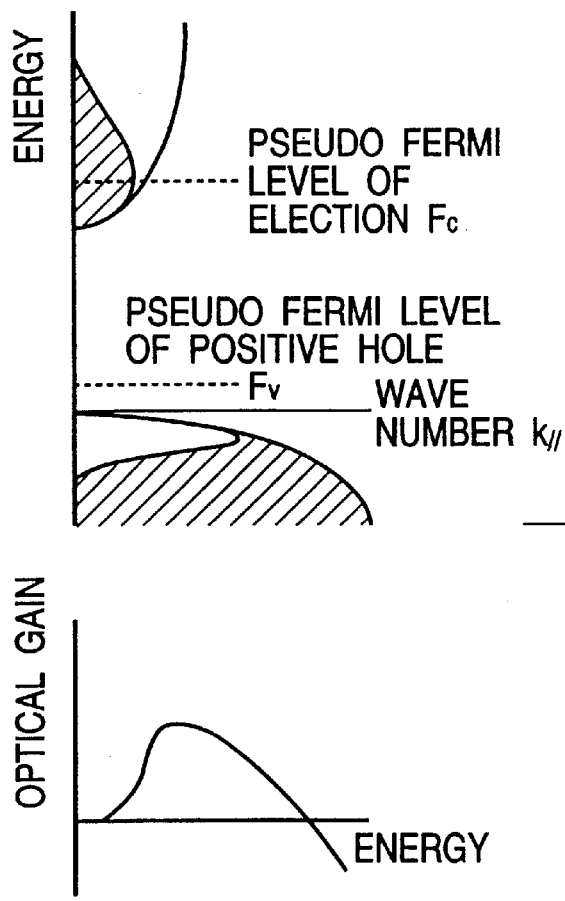
FIGS. 11A and 11B are band structure diagrams illustrating the optical transition probability.
Figure 11B:
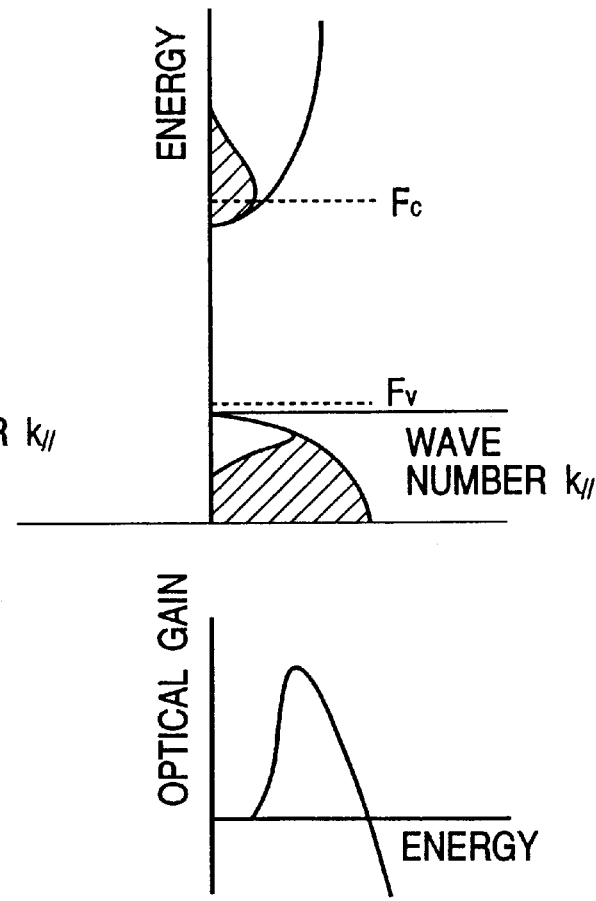

Next, the stacked structure on the substrate 1 is annealed at a temperature ranging from 400 to 800° C. for 20 to 60 min for activating the p-type layers. Then, to form an n-type electrode, as shown in FIG. 8, part of the grown semiconductor layers are subjected to dry-etching, to expose the n-type GaN buffer layer 3. Subsequently, a metal film made from such as Au or Al is formed, followed by patterning, to form both a p-side electrode 10 and an n-side electrode 11. In general, a plurality of semiconductor laser devices are formed on one wafer, and accordingly, the stacked structure on the substrate 1 is cleaved into resonators each having a length of 800 $\mu$m along the (0001) plane, to manufacture semiconductor laser devices.

In the semiconductor laser device thus obtained, continuous oscillation was realized at a threshold current of about 60 mA at room temperature and the oscillation wavelength was about 420 nm.

<Fifth Embodiment>

Figure 19:
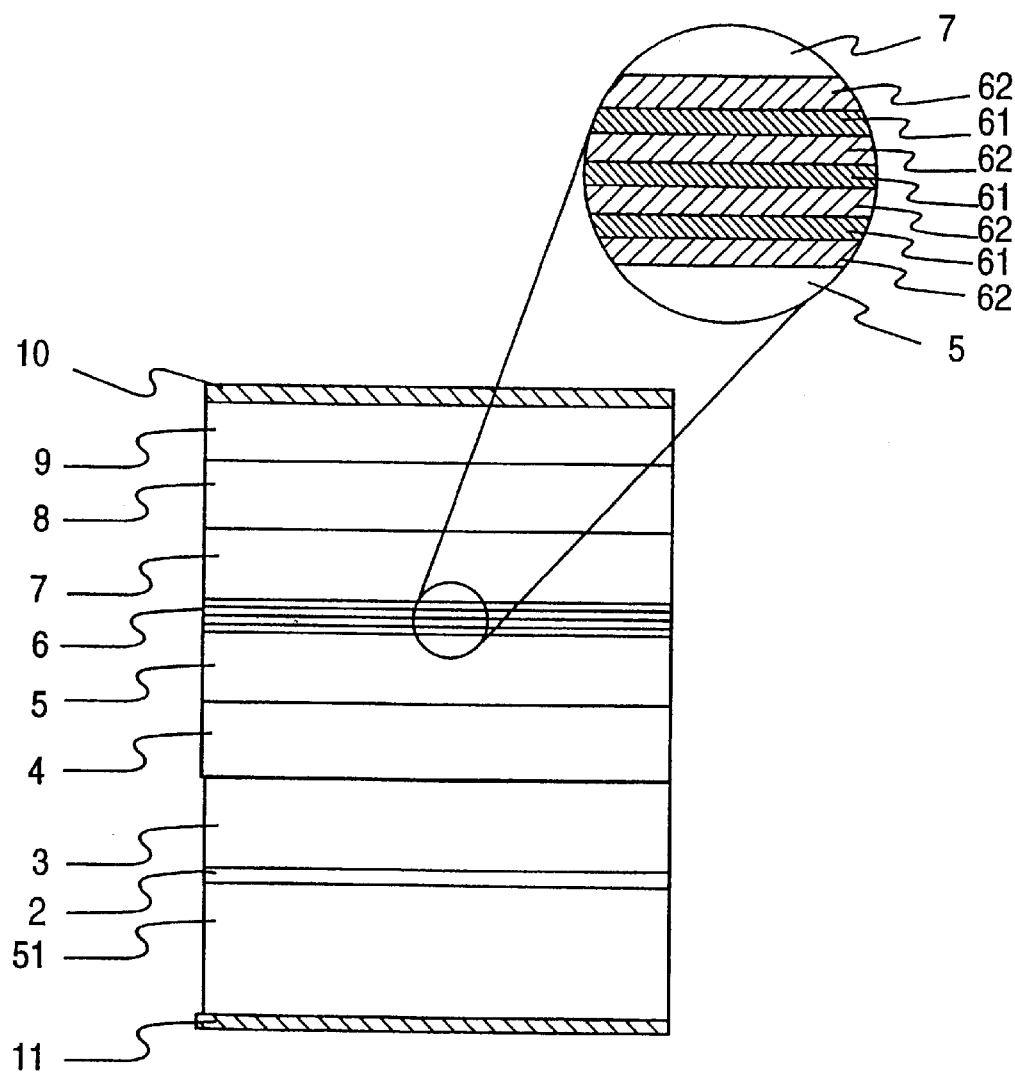
FIG. 19 is a sectional view of a semiconductor laser device according to one embodiment of the present invention.

FIG. 19 is a structural sectional view, taken from a plane crossing an optical axis, showing a semiconductor laser device in this embodiment.

The semiconductor laser device having a multi-quantum well structure in this example is formed by sequentially stacking, on an n-type SiC substrate 51 with the (1,0,−1,0) plane taken as the principle plane thereof, a low temperature buffer layer 2 made from n-type GaN, a high temperature buffer layer 3 made from n-type GaN, an n-type $Al_{0.2}Ga_{0.8}N$ cladding layer 4, an n-type GaN optical guide layer 5, a GaInN multi-quantum well active region 6, a p-type GaN optical guide layer 7, a p-type $Al_{0.2}Ga_{0.8}N$ cladding layer 8, and a p-type GaN cap layer 9. Each of these layers (and region) is formed by epitaxial growth by the usual metal organic vapor phase epitaxial growth method. The thickness of each layer is set at 0.05 $\mu$m (low temperature buffer layer 2), 3 $\mu$m (high temperature buffer layer 3), 0.3 $\mu$m (n-type cladding layer 4), 0.1 $\mu$m (n-type optical guide layer 5), 0.1 $\mu$m (p-type optical guide layer 7), 0.3 $\mu$m (p-type cladding layer 8), and 0.5 $\mu$m (cap layer 9).

The multi-quantum well active region 6, as shown on the enlarged scale, has a multi-quantum well structure in which three pieces of undoped $Ga_{0.8}In_{0.2}N$ well layers 61 each having a thickness of 5 nm and three pieces of n-doped $Ga_{0.95}In_{0.05}N$ barrier layers 62 each being doped with an n-type impurity at the density of $1.6\times10^{19}$ cm$^{-3}$ and having a thickness of 7 nm are alternately stacked to each other.

Here, the density of the impurity doped in the barrier layer 62 is set such that the density of electrons released from the impurity and locally present in the well layer becomes $3.0\times10^{19}$ cm$^{-3}$. The oriented plane of the quantum-well is the (1.0,−1.0) plane. Here, the composition of the well layer 61 is set such that the displacement of the lattice constant from the lattice constant in the unstrained state becomes $e_a=1.0\%$, $e_c=1.1\%$, and a biaxial compressive strain is applied. The biaxial strain means a strain caused by a stress applied to crystal lattices of different kinds of crystal layers resulting from a difference between both crystal lattices at an interface at which the different kinds of crystal layers are bonded to each other, which strain may be simply called "strain" or "lattice strain". A difference ΔEg in band gap energy between the cladding layer and quantum-well layer is set at 0.8 eV. Next, the stacked structure on the substrate 1 is annealed at a temperature ranging from 400 to 800° C. for 20 to 60 mm for activating the p-type layers.

Subsequently, a metal film made from Au or Al is formed, followed by patterning, to form both a p-side electrode 10 and an n-side electrode 11. The stacked structure on the substrate 1 is then cleaved into resonators each having a length of 800 $\mu$m along the (0001) plane, to manufacture semiconductor laser devices.

In the semiconductor laser device thus obtained, continuous oscillation was realized at a threshold current of about 60 mA at room temperature and the oscillation wavelength was about 420 nm.

<Sixth Embodiment>

Figure 20:
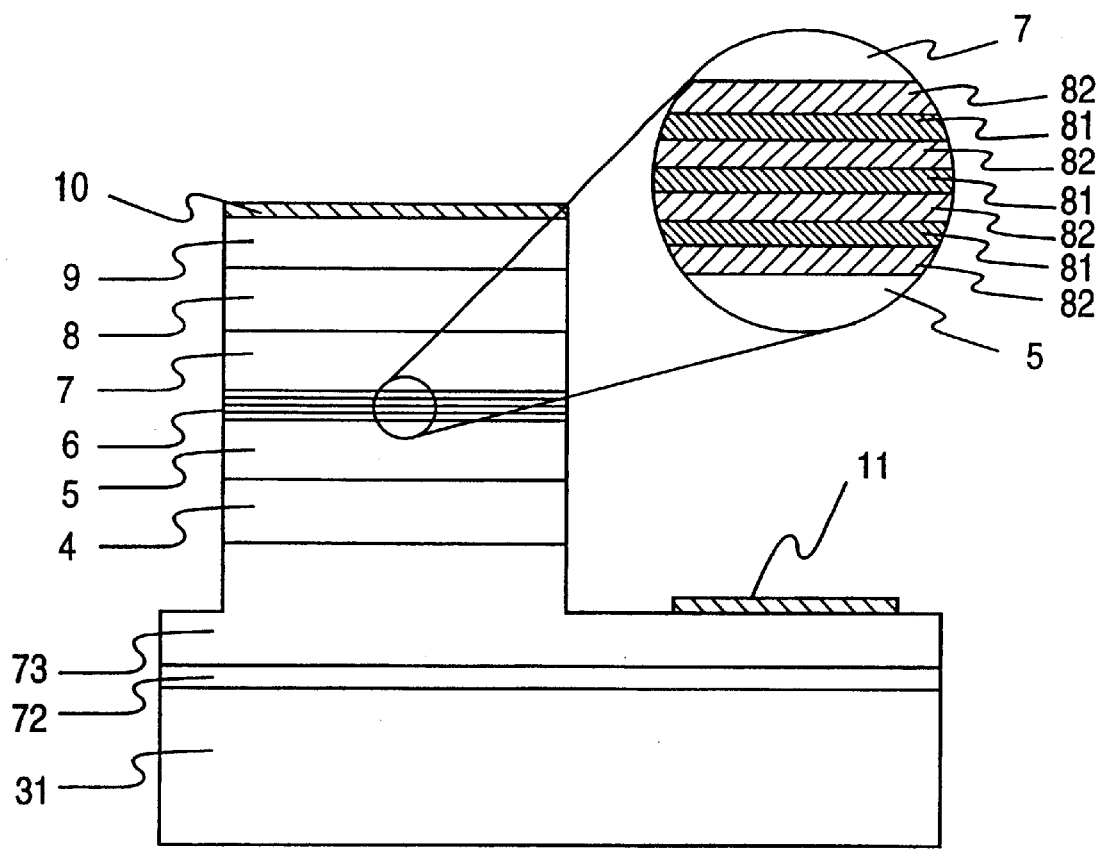
FIG. 20 is a sectional view of a semiconductor laser device according to one embodiment of the present invention.

FIG. 20 is a structural sectional view, seen from a plane crossing an optical axis, showing a semiconductor laser device in this embodiment.

The semiconductor laser device having a multi-quantum well structure in this example is formed by sequentially stacking, on a sapphire substrate 31 with the (1,0,−1,2) plane taken as the principle plane thereof, a low temperature buffer layer 72 made from n-type AlN, a high temperature buffer layer 73 made from n-type AlN, an n-type $Al_{0.2}Ga_{0.8}N$ cladding layer 4, an n-type GaN optical guide layer 5, a GaInN multi-quantum well active region 6, a p-type GaN optical guide layer 7, a p-type $Al_{0.2}Ga_{0.8}N$ cladding layer 8, and a p-type GaN cap layer 9. Each of these layers is formed by epitaxial growth by the usual metal organic vapor phase epitaxial growth method. The thickness of each layer is set at 0.05 μm (low temperature buffer layer 2), 3 μm (high temperature buffer layer 3), 0.3 μm (n-type cladding layer 4), 0.1 μm (n-type optical guide layer 5), 0.1 μm (p-type optical guide layer 7), 0.3 μm (p-type cladding layer 8), and 0.5 μm (cap layer 9)

The multi-quantum well active region 6, as shown on the enlarged scale, has a multi-quantum well structure in which three pieces of undoped $Ga_{0.8}In_{0.2}N$ well layers 81 each having a thickness of 4 nm and three pieces of undoped GaN barrier layers 82 each having a thickness of 6 nm are alternately stacked to each other. The oriented plane of the quantum-well is the (1,0,−1,2) plane. Here, the composition of the well layer 81 is set such that the displacement of the lattice constant from the lattice constant in the unstrained state becomes $e_a$=0.1%, $e_c$=1.6%, and a biaxial compressive strain is applied. Next, the stacked structure on the substrate 1 is annealed at a temperature ranging from 400 to 800° C. for 20 to 60 min for activating the p-type layers.

Then, to form an n-type electrode, part of the grown semiconductor layers are subjected to dry-etching, to expose the n-type AlN buffer layer 73. Subsequently, a metal film made from Au or Al is formed, followed by patterning, to form both a p-side electrode 10 and an n-side electrode 11. The stacked structure on the substrate 1 is cleaved into resonators each having a length of 800 μm along the (−1,2,−1,0) plane, to manufacture semiconductor laser devices.

In the semiconductor laser device thus obtained, continuous oscillation was realized at a threshold current of about 60 mA at room temperature and the oscillation wavelength was about 420 nm.

<Seventh Embodiment>

Figure 21:
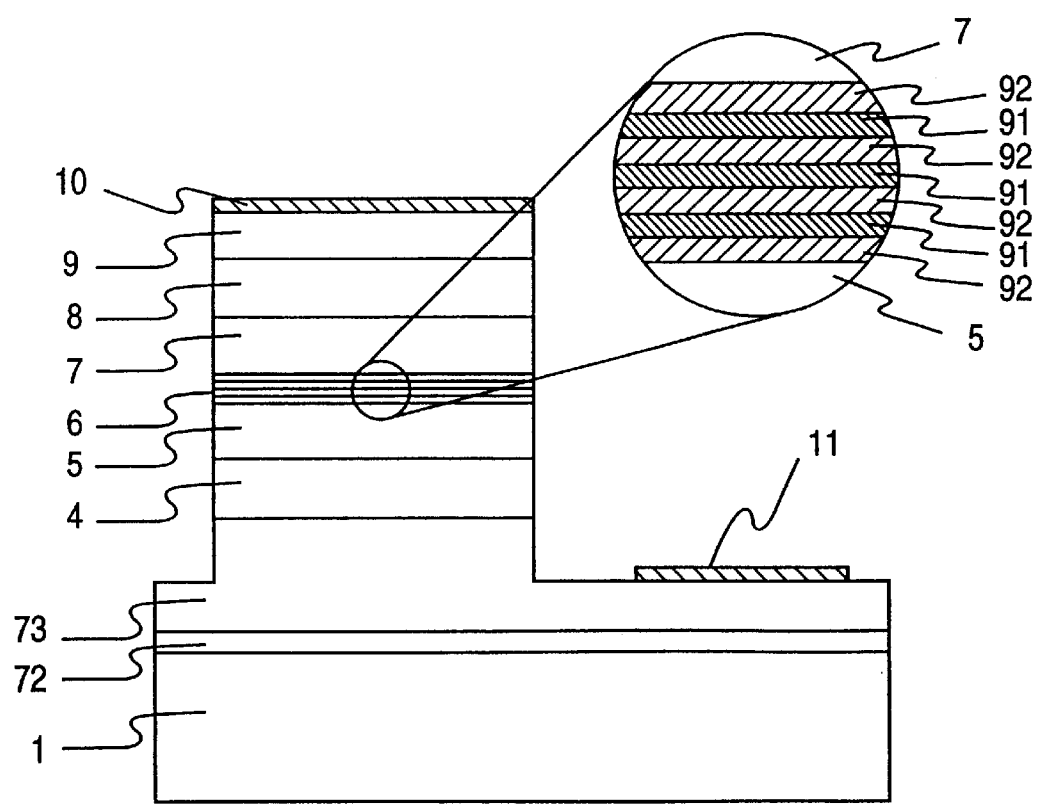
FIG. 21 is a sectional view of a semiconductor laser device according to one embodiment of the present invention.

FIG. 21 is a structural sectional view, seen from a plane crossing an optical axis, showing a semiconductor laser device in this embodiment.

The semiconductor laser device having a multi-quantum well structure in this example is formed by sequentially stacking, on a sapphire substrate 1 with the (0001) plane taken as the principle plane thereof, a low temperature buffer layer 72 made from n-type AlN, a high temperature buffer layer 73 made from n-type AlN, an n-type $Al_{0.2}Ga_{0.8}N$ cladding layer 4, an n-type GaN optical guide layer 5, a GaInN multi-quantum well active region 6, a p-type GaN optical guide layer 7, a p-type $Al_{0.2}Ga_{0.8}N$ cladding layer 8, and a p-type GaN cap layer 9. Each of these layers is formed by epitaxial growth by the usual metal organic vapor phase epitaxial growth method. The thickness of each layer is set at 0.05 μm (low temperature buffer layer 2), 3 μm (high temperature buffer layer 3), 0.3 μm (n-type cladding layer 4), 0.1 μm (n-type optical guide layer 5), 0.1 μm (p-type optical guide layer 7), 0.3 μm (p-type cladding layer 8), and 0.5 μm (cap layer 9).

The multi-quantum well active region 6, as shown on the enlarged scale, has a multi-quantum well structure in which three pieces of undoped $Ga_{0.8}In_{0.2}N$ well layers 91 each having a thickness of 4 nm and three pieces of undoped GaN barrier layers 92 each having a thickness of 6 nm are alternately stacked to each other. The oriented plane of the quantum-well is the (1,1,−2,4) plane. Here, the composition of the well layer 91 is set such that the displacement of the lattice constant from the lattice constant in the unstrained state becomes $e_a$=1.0%, $e_c$=1.6%, and a biaxial compressive strain is applied. Next, the stacked structure on the substrate 1 is annealed at a temperature ranging from 400 to 800° C. for 20 to 60 min for activating the p-type layers. Then, to form an n-type electrode, part of the grown semiconductor layers are subjected to dry-etching, to expose the n-type AlN buffer layer 73. Subsequently, a metal film made from Au or Al is formed, followed by patterning, to form both a p-side electrode 10 and an n-side electrode 11. The stacked structure on the substrate 1 is cleaved into resonators each having a length of 800 μm along the (1,−1,0,0) plane, to manufacture semiconductor laser devices.

In the semiconductor laser device thus obtained, continuous oscillation was realized at a threshold current of about 60 mA at room temperature and the oscillation wavelength was about 420 nm.

<Eighth Embodiment>

Figure 22:
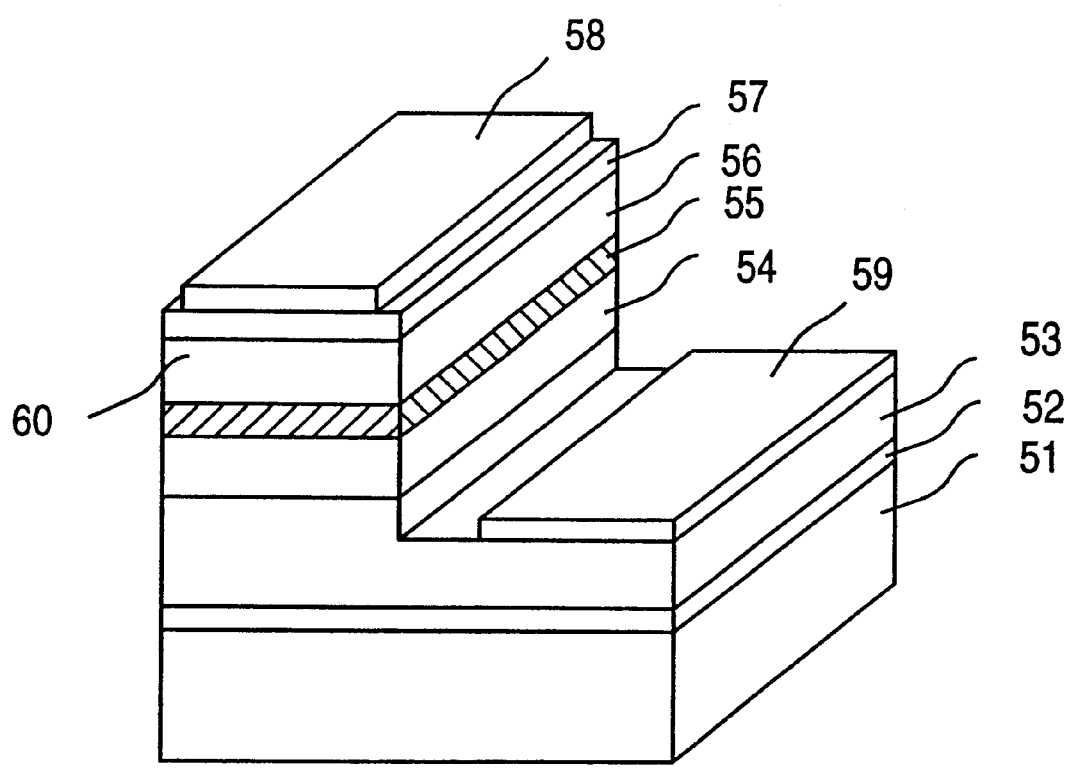
FIG. 22 is a perspective view of a semiconductor laser device according to one embodiment of the present invention.

FIG. 22 is a perspective view showing a semiconductor laser device according to a eighth embodiment of the present invention, and FIGS. 23A to 23D are sectional views, seen along the direction crossing the optical axis, illustrating the manufacturing process of the semiconductor laser device. Hereinafter, the semiconductor laser device and its manufacturing process according to the present invention will be described with reference to these figures.

Figure 23A:
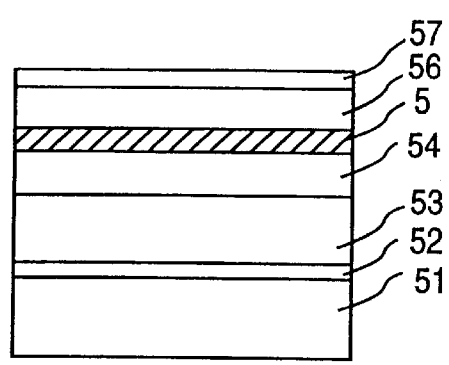
FIGS. 23A, 23B, 23C and 23D are sectional views showing a semiconductor laser device according to one embodiment of the present invention in the order of manufacturing steps thereof.

As shown in FIG. 23A, a buffer layer 52 (GaN, 0.1 μm), an n-type contact layer 53 (GaN, 2 μm), an n-type cladding layer 54 (AlGaN, 1 μm), a strained quantum-well active layer 55 [(five layers of GaN (3 nm) and five layers of $Al_{0.4}Ga_{0.6}N$ (5 nm) are alternately stacked], a p-type cladding layer 56 (AlGaN, 1 μm), and p-type contact layer 57 (GaN, 0.3 μm) are sequentially formed on a GaN substrate 51 having the (1,0,−1,2) plane by the metal organic vapor phase epitaxial growth (MOVPE) method. Here, the crystal growth direction on the substrate is inclined 43° from the c-plane, that is, (0001) plane. In other words, the crystal growth plane becomes the R-plane, that is, the (1,0,−1,2) plane.

Figure 23B:
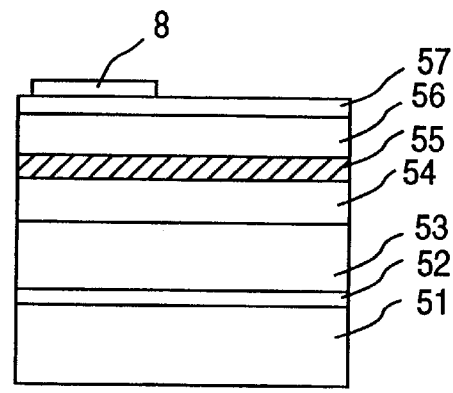
Figure 23C:
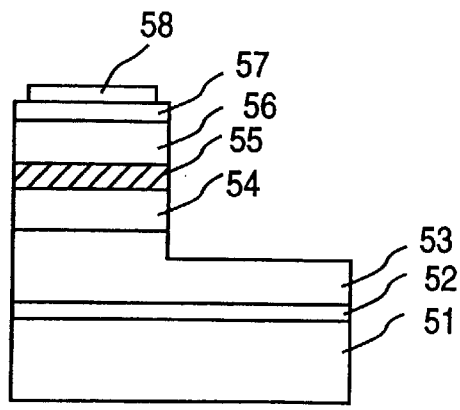
Figure 23D:
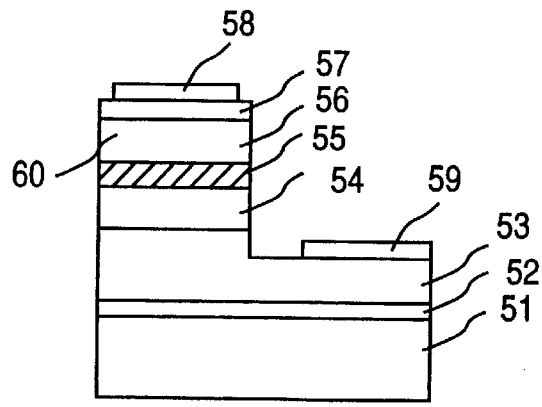

Next, a p-type electrode 58 is formed on the p-type contact layer 57 (see FIG. 23B). Then, the stacked layers are removed by usual etching from part of the surface of the p-type contact layer 57 to the n-type contact layer 53 (see FIG. 23C), to form an n-type electrode 59 on the n-type contact layer 53 (see FIG. 23D). Finally, the stacked structure is separated into chips (laser resonators) in such a manner that an end surface 60 of the laser resonator becomes the (1,2,−1,0) plane, to obtain semiconductor laser devices. FIG. 22 is the perspective view showing the finished semiconductor laser. In addition, from the viewpoint of practical use, the semiconductor laser device may be further processed by, for example, forming a protective film for protecting the light emission end surface.

The semiconductor laser device in this embodiment is capable of emitting blue color light oscillating at a threshold current of 40 mA.

In addition, a semiconductor laser device may be obtained by forming an active layer having a strained quantum-well structure through crystal growth on the following substrate. Such a semiconductor laser device also exhibits the same effect.

| sample No. | substrate | inclination angle | crystal growth plane |
|---|---|---|---|
| No. 1 | (1, 0, −1, 3) GaN | 32° | (1, 0. −1, 3) |
| No. 2 | (1, 0, −1, 4) GaN | 25° | (1, 0. −1, 4) |

The present invention may be effectively applied to structures other than that described in the sixth embodiment. For example, the substrate may be made from not only GaN but also another material having the wurtzite-type crystal structure, for example, sapphire, spinel, SiC, ZnO, MgO, MnO, SiO$_2$, or AlN.

<Ninth Embodiment>

This embodiment will be described with reference to FIG. 22 and FIGS. 23A to 23D.

A buffer layer 52 (GaN doped with Mg, 0.1 μm), an n-type contact layer 53 (GaN, 2 μm), an n-type cladding layer 54 (AlGaN, 1 μm), a strained quantum-well active layer 55 [(five layers of In$_{0.2}$Ga$_{0.8}$N (3 nm) and five layers of GaN (5 nm) are alternately stacked], a p-type cladding layer 56 (AlGaN, 1 μm), and p-type contact layer 57 (GaN, 0.3 μm) are sequentially formed on a sapphire substrate 51 having the (0001) plane by the metal organic vapor phase epitaxial growth (MOVPE) method (see FIG. 22A). Here, the crystal growth direction on the substrate is inclined 39° from the c-plane, that is, (0001) plane. Accordingly, the crystal growth plane becomes the (1,1,−2,4) plane.

Next, like the eighth embodiment, a p-type electrode 58 is formed on the p-type contact layer 7, and the stacked layers are removed by usual etching from part of the surface of the p-type contact layer 57 to the n-type contact layer 53 (see FIG. 23C), to form an n-type electrode 59 at a specific position on the n-type contact layer 53. Finally, the stacked structure is separated into chips (laser resonators) in such a manner that an end surface 60 of the laser resonator becomes the (1,−1,0,0) plane, to obtain semiconductor laser devices. FIG. 22 is the perspective view showing the finished semiconductor laser device. In addition, from the viewpoint of practical use, the semiconductor laser device may be further processed by, for example, forming a protective film for protecting the light emission end surface.

The semiconductor laser device in this embodiment is capable of emitting blue color light oscillating at a threshold current of 50 mA.

The present invention can be applied not only to the device structures described in the above embodiments but also to various kinds of semiconductor laser devices such as a distribution feedback type laser, Bragg reflection type laser, wavelength variable laser, external resonator mounted laser, and surface emission laser.

The gallium nitride based semiconductor material is not limited to that having the above composition but may be selected from materials having a structural formula expressed by AlxGayIn1−x−yN (0≦x<1, 0<y≦1, 0<x+y≦1), wherein the values x and y may be set such that the band gap energy of the active layer becomes smaller than the band gap energy of the cladding layer. Further, in the present invention, there may be used a material in which part of N of the above structural formula AlxGayIn1−x−yN is substituted for As or P.

INDUSTRIAL APPLICABILITY

The optical information processing equipment of the present invention can be applied to optical information processing equipment adopting photomagnetic recording or phase transition recording method. The light source of the present invention can be applied to the above optical information processing equipment. The semiconductor light emitting device of the present invention can be applied to the above optical information processing equipment and further used as a light source allowing emission of blue light, blue-violet light and violet light.

What is claimed is:

1. A semiconductor light emitting device comprising:
    at least a strained quantum-well active layer region made from a wurtzite type semiconductor material,
    wherein a crystal growth direction of said strained quantum-well active layer region is parallel to an axis which is inclined 5° to 70° from the [0001] axis (c-axis),
    wherein said strained quantum-well active layer region constitutes part of a semiconductor laser resonator, and
    wherein an end surface of said semiconductor laser resonator is parallel to a plane containing both the crystal growth axis of said strained quantum-well active layer region and the [0001] axis (c-axis).

2. A semiconductor light emitting device according to claim 1,
    wherein said end surface of said semiconductor laser resonator is equivalent to the (−1,2,−1,0) plane.

3. A semiconductor light emitting device according to claim 1,
    wherein said end surface of said semiconductor laser resonator is equivalent to the (−1,0,31 1,0) plane.

4. A semiconductor light emitting device comprising:
    at least a strained quantum-well active layer region made from a wurtzite type semiconductor material,
    wherein a crystal growth direction of said strained quantum-well active layer region is parallel to an axis which is inclined 10° to 60° from the [0001] axis (c-axis),
    wherein said strained quantum-well active layer region constitutes part of a semiconductor laser resonator, and
    wherein an end surface of said semiconductor laser resonator is parallel to a plane containing both the crystal growth axis of said strained quantum-well active layer region and the [0001] axis (c-axis).

5. A semiconductor light emitting device according to claim 4,
    wherein said end surface of said semiconductor laser resonator is equivalent to the (−1,2,−1,0) plane.

6. A semiconductor light emitting device according to claim 4,
    wherein said end surface of said semiconductor laser resonator is equivalent to the (−1,0,−1,0) plane.

7. A semiconductor light emitting device comprising:
    at least a strained quantum-well active layer region made from a wurtzite type semiconductor material,
    wherein a crystal growth direction of said strained quantum-well active layer region is parallel to an axis which is inclined 20° to 55° from the [0001] axis (c-axis),
    wherein said strained quantum-well active layer region constitutes part of a semiconductor laser resonator, and
    wherein an end surface of said semiconductor laser resonator is parallel to a plane containing both the crystal growth axis of said strained quantum-well active layer region and the [0001] axis (c-axis).

8. A semiconductor light emitting device according to claim 7,
    wherein said end of surface of said semiconductor laser resonator is equivalent to the (−1,2,−1,0) plane.

9. A semiconductor light emitting device according to claim 7,
    wherein said end surface of said semiconductor laser resonator is equivalent to the (−1,0,−1,0) plane.

* * * * *